(12) United States Patent
Kobuchi et al.

(10) Patent No.: US 6,541,984 B2
(45) Date of Patent: Apr. 1, 2003

(54) METHOD AND SYSTEM FOR MEASURING ELECTROMAGNETIC WAVES, AND RECORDING MEDIUM IN WHICH ELECTROMAGNETIC WAVE MEASUREMENT CONTROL PROGRAM IS RECORDED

(75) Inventors: Kenji Kobuchi, Kawasaki (JP); Ryouji Takano, Kawasaki (JP); Yutaka Matsukuma, Kawasaki (JP); Toru Hirose, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/892,720

(22) Filed: Jun. 27, 2001

(65) Prior Publication Data

US 2002/0093341 A1 Jul. 18, 2002

(30) Foreign Application Priority Data

Jan. 12, 2001 (JP) ........................................ 2001-005277

(51) Int. Cl.⁷ .............................................. G01R 27/04
(52) U.S. Cl. ...................................................... 324/637
(58) Field of Search .......................... 324/637, 96, 332, 324/336, 612, 627, 628; 703/14, 20, 21; 702/40, 158, 159

(56) References Cited

FOREIGN PATENT DOCUMENTS

| JP | 05-333073 | 12/1993 |
| JP | 06-043197 | 2/1994 |
| JP | 10-150583 | 6/1998 |

*Primary Examiner*—Michael Nghiem
(74) *Attorney, Agent, or Firm*—Katten Muchin Zavis Rosenman

(57) ABSTRACT

An electromagnetic wave measurement system includes an electromagnetic wave emitting unit, measurement condition changing unit for changing a measurement condition, a control unit controlling the electromagnetic wave emitting unit and the measurement condition changing unit based on actual measurement data of the object electronic circuit, which data has previously been measured under a predetermined measurement condition, and measurement condition data of the predetermined measurement condition in such a manner that electromagnetic waves resembling those of the object electronic circuit is emitted from the electromagnetic wave emitting unit under the same condition as the predetermined measurement condition. With this system, since the electromagnetic wave emitting unit emits electromagnetic waves exactly resembling those of electronic circuits constitute an electronic device, it is possible to perform the electromagnetic wave measurement as if all the electronic circuits are collected even when all the electronic circuits are not collected.

39 Claims, 10 Drawing Sheets

| HEIGHT OF MEASUREMENT ANTENNA [m] | DIRECTION OF MEASUREMENT ANTENNA HORIZON/VERTICAL | ANGLE OF ROTATION OF TURNTABLE [°] | FREQUENCY [MHz] | ELECTRIC FIELD INTENSITY [dBµV/m] |
|---|---|---|---|---|
| 1 | HORIZON | 0 | 30.0 | MEASUREMENT DATA |
| 1 | HORIZON | 0 | 30.1 | MEASUREMENT DATA |
| 1 | HORIZON | 0 | 30.2 | MEASUREMENT DATA |
| ⋮ | ⋮ | ⋮ | ⋮ | ⋮ |
| 1 | HORIZON | 0 | 1000.0 | MEASUREMENT DATA |
| 1 | HORIZON | 5 | 30.0 | MEASUREMENT DATA |
| 1 | HORIZON | 5 | 30.1 | MEASUREMENT DATA |
| 1 | HORIZON | 5 | 30.2 | MEASUREMENT DATA |
| ⋮ | ⋮ | ⋮ | ⋮ | ⋮ |
| 1 | HORIZON | 5 | 1000.0 | MEASUREMENT DATA |
| ⋮ | ⋮ | ⋮ | ⋮ | ⋮ |
| 1 | HORIZON | 360 | 30.0 | MEASUREMENT DATA |
| 1 | HORIZON | 360 | 30.1 | MEASUREMENT DATA |
| 1 | HORIZON | 360 | 30.2 | MEASUREMENT DATA |
| ⋮ | ⋮ | ⋮ | ⋮ | ⋮ |
| 1 | HORIZON | 360 | 1000.0 | MEASUREMENT DATA |
| 1.5 | HORIZON | 0 | 30.0 | MEASUREMENT DATA |
| 1.5 | HORIZON | 0 | 30.1 | MEASUREMENT DATA |
| 1.5 | HORIZON | 0 | 30.2 | MEASUREMENT DATA |
| ⋮ | ⋮ | ⋮ | ⋮ | ⋮ |
| 1 | HORIZON | 0 | 1000.0 | MEASUREMENT DATA |
| 1.5 | HORIZON | 5 | 30.0 | MEASUREMENT DATA |
| 1.5 | HORIZON | 5 | 30.1 | MEASUREMENT DATA |
| 1.5 | HORIZON | 5 | 30.2 | MEASUREMENT DATA |
| ⋮ | ⋮ | ⋮ | ⋮ | ⋮ |
| 1.5 | HORIZON | 5 | 1000.0 | MEASUREMENT DATA |
| ⋮ | ⋮ | ⋮ | ⋮ | ⋮ |
| 1.5 | HORIZON | 360 | 30.0 | MEASUREMENT DATA |
| 1.5 | HORIZON | 360 | 30.1 | MEASUREMENT DATA |
| 1.5 | HORIZON | 360 | 30.2 | MEASUREMENT DATA |
| ⋮ | ⋮ | ⋮ | ⋮ | ⋮ |
| 1.5 | HORIZON | 360 | 1000.0 | MEASUREMENT DATA |
| ⋮ | ⋮ | ⋮ | ⋮ | ⋮ |
| 4 | HORIZON | 0 | 30.0 | MEASUREMENT DATA |
| 4 | HORIZON | 0 | 30.1 | MEASUREMENT DATA |
| 4 | HORIZON | 0 | 30.2 | MEASUREMENT DATA |
| ⋮ | ⋮ | ⋮ | ⋮ | ⋮ |
| 4 | HORIZON | 0 | 1000.0 | MEASUREMENT DATA |
| 4 | HORIZON | 5 | 30.0 | MEASUREMENT DATA |
| 4 | HORIZON | 5 | 30.1 | MEASUREMENT DATA |
| 4 | HORIZON | 5 | 30.2 | MEASUREMENT DATA |
| ⋮ | ⋮ | ⋮ | ⋮ | ⋮ |
| 4 | HORIZON | 5 | 1000.0 | MEASUREMENT DATA |
| ⋮ | ⋮ | ⋮ | ⋮ | ⋮ |
| 4 | HORIZON | 360 | 30.0 | MEASUREMENT DATA |
| 4 | HORIZON | 360 | 30.1 | MEASUREMENT DATA |
| 4 | HORIZON | 360 | 30.2 | MEASUREMENT DATA |
| ⋮ | ⋮ | ⋮ | ⋮ | ⋮ |
| 4 | HORIZON | 360 | 1000.0 | MEASUREMENT DATA |
| 1 | VERTICAL | 0 | 30.0 | MEASUREMENT DATA |
| ⋮ | ⋮ | ⋮ | ⋮ | ⋮ |

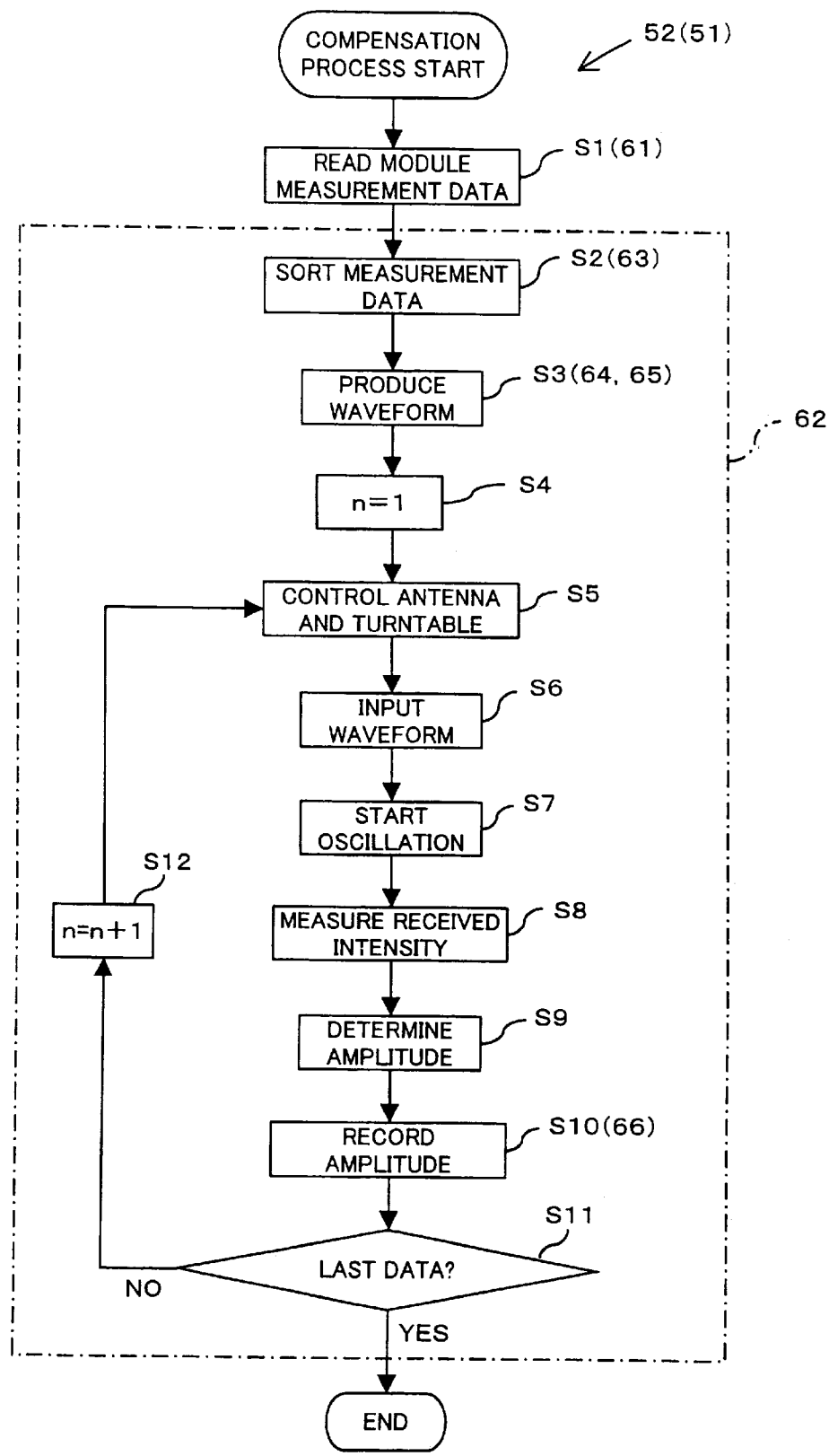

201: ANECHOIC CHAMBER
202: MEASUREMENT ROOM

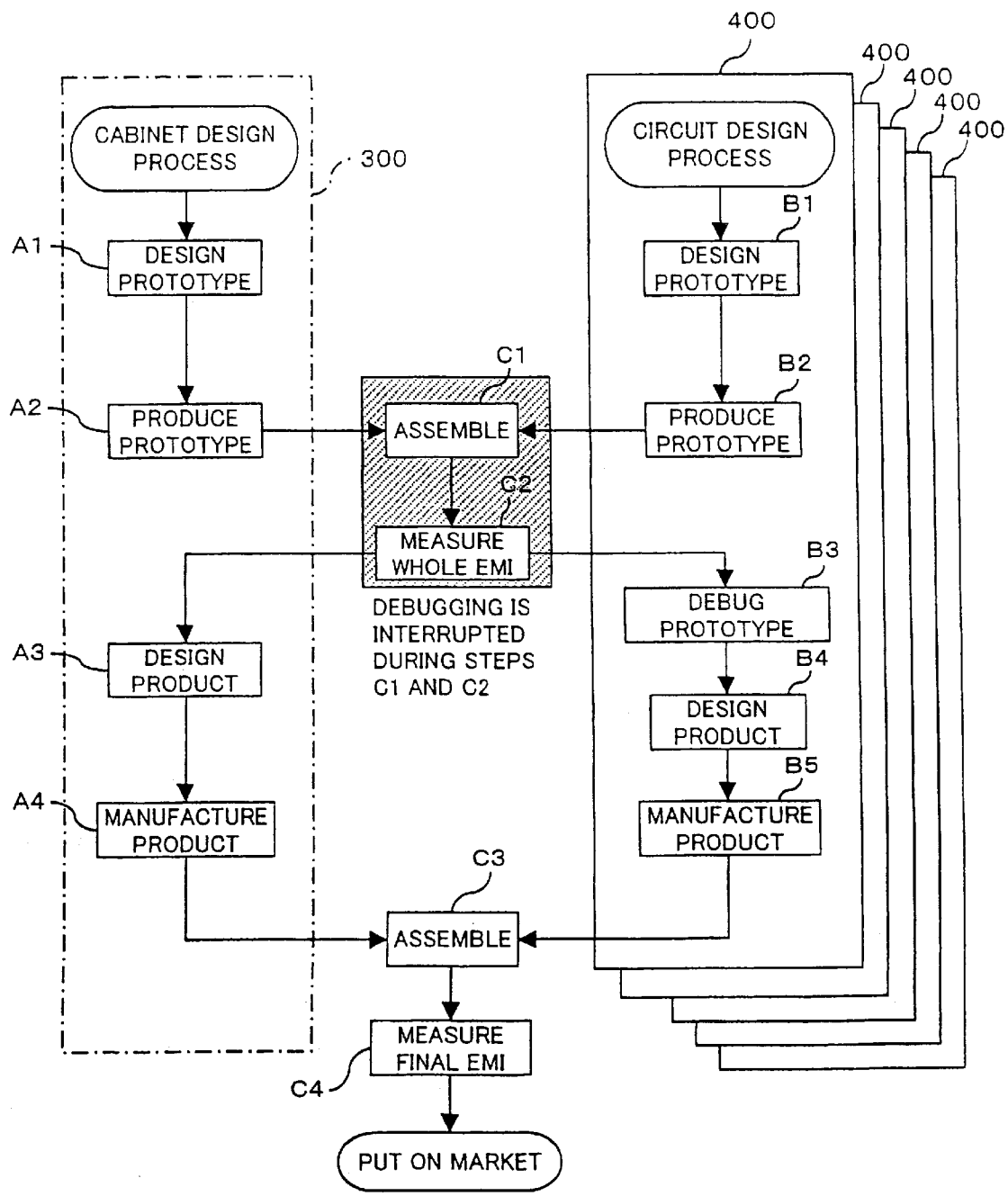

METHOD AND SYSTEM FOR MEASURING ELECTROMAGNETIC WAVES, AND RECORDING MEDIUM IN WHICH ELECTROMAGNETIC WAVE MEASUREMENT CONTROL PROGRAM IS RECORDED

BACKGROUND OF THE INVENTION

1. Field of the Invention

The present invention relates to a system and a method for measuring electromagnetic waves, and a recording medium in which electromagnetic wave measurement control program is recorded. More particularly, the invention relates to measurement of electromagnetic waves emitted from an electronic device, which uses at least one electronic circuit, as electromagnetic interference.

2. Description of the Related Art

An apparatus or device including at least one electronic circuit (hereinafter called the electronic device) leaks electromagnetic waves out of the electronic device. The leaked electromagnetic waves would be electromagnetic interference causing malfunction and trouble in its peripheral devices. Consequently, electronic devices now put on the market are bound to suffice a gauge with respect to EMI (electromagnetic interference), which gauge is regulated by the Voluntary Control Council for Information Technology Equipment (VCCI).

For this purpose, electronic device manufacturers generally measure EMI of a model of the object electronic device at first, and then improve the electronic device in design based on the result of the EMI measurement on the model. The term "model" of the electronic device means an aggregation of models of one or more electronic circuits and a cabinet; the electronic circuits unitedly serve to perform operations of the electronic device and emit electromagnetic waves; while the cabinet accommodates and protects the electronic circuits and prohibits the leak of electromagnetic waves out of the electronic device.

Generally, the EMI measurement is performed using an EMI measurement system 100 shown in FIG. 8. In practice, a model (a measurement object) of an electronic device is disposed on a turntable 111, which angularly moves or rotates through 360 degrees about a vertical axis, in an anechoic chamber 101. A measuring antenna 112 measures (receives) electromagnetic waves emitted by (leaked from) the measurement object 113. And a spectrum analyzer 123 in a measurement room 102 analyzes electric field intensities, which correspond to respective frequencies, of the electromagnetic waves received by the measuring antenna 112.

The distance between the measurement object 113 and the measuring antenna 112 is approximately 3 meters or 10 meters as regulated in accordance with the gauge. The spectrum analyzer 123 is connected to a control personal computer (hereinafter also called the control PC) 124 by a general purpose interface bus (GPIB). The result of analysis by the spectrum analyzer 123 is sent to the control PC 124 as EMI measurement result data, and the control PC 124 stores the result in a storage unit 125, such as a hard disk.

The measurement object 113 emits electromagnetic waves in all directions. It is enough that the highest electric field intensity of the electromagnetic waves emitted from the measurement object 113 is lower than an intensity regulated by VCCI as an EMI gauge (hereinafter called the VCCI gauge). For this purpose, it is necessary to identify a point where the electromagnetic wave corresponding to the highest intensity is received. To identify the point, the electric field intensity of the received electromagnetic wave is measured under a measurement condition, which is changed by angularly moving or rotating the turntable 111 to change the orientation or posture of the measurement object 113 within the horizontal plane and also to change the height of the measuring antenna 112 within the range from 1 meter to 4 meters.

Although the measurement condition changing in, e.g., the angle of rotation of the turntable 111 or the height of the measurement antenna 112, may be manually performed, the control PC 124 disposed in the measurement room 102 automatically controls a turntable rotation motor 111a and an antenna height control motor 112a using a turntable controller 121 and an antenna height controller 122, which are connected to the control PC 124 by GPIB or the like.

In the conventional EMI measurement, the measuring antenna 112 receives electromagnetic waves under the various measurement conditions in which the angle of rotation of the turntable 111 and the height of the measuring antenna 112 are changed, thereby measuring the electromagnetic waves (emitted from the measurement object 113) with respect to all directions. Finally, it is discriminated whether or not the highest electric field intensity meets the VCCI gauge.

The intensity of the electromagnetic waves emitted from the measurement object 113 highly depends on not only the electromagnetic waves emitted from individual electronic circuits but also the electromagnetic shield characteristic of the cabinet accommodating the electronic circuits. When the cabinet has a superior electromagnetic shield characteristic, it is possible for the measurement object 113 to meet the VCCI gauge despite of a relatively high electric field intensity of the electromagnetic waves emitted by the electronic circuits. Therefore, if it is impossible for the electronic circuits to reduce generation of the electromagnetic wave any more, the electromagnetic shield of the cabinet is reinforced so that the electromagnetic waves emitted from the measurement object 113 would meet the VCCI gauge as a whole.

As mentioned above, since the electromagnetic shield characteristic of the cabinet is highly regarded satisfaction with the VCCI gauge, there have been proposed systems for measuring (evaluating) the cabinet module in terms of the electromagnetic shield characteristic. Such measurement system is exemplified by Japanese Patent Laid-Open Publication No. HEI 6-43197 (see a measurement system 200 as shown in FIG. 9 of the accompanying drawings).

The measurement system 200 of FIG. 9 performs EMI measurement as follows:

First of all, a transmitting antenna (spheric dipole antenna) 214, which is supposed to be an electronic circuit that emits electromagnetic waves, is accommodated in the cabinet 213 in an experimental site 201, such as an anechoic chamber. An oscillator (signal generator) 221 in a measurement room 202 is driven so as to produce an electric signal causing the transmitting antenna 214 to emit electromagnetic waves. Then, the electric signal is converted into an optical signal by an electric/optical (E/O) converter 222, whereupon the optical signal is introduced to the transmitting antenna 214 via a sending optical fiber cable 203.

The transmitting antenna 214 is in the form of a spheric conductor having such a size as to be accommodated in the cabinet 213 (e.g., 15 cm in diameter). A non-illustrated optical/electric (O/E) converter and a battery or the like are incorporated in the transmitting antenna 214. The O/E converter in the transmitting antenna 214 converts an optical signal, which has been received through the optical fiber cable 203, into an electric signal in the form of electromagnetic waves, which are emitted uniformly in all directions over the experimental site 201.

Electromagnetic waves leaked from the cabinet 213 are received by a measuring antenna (receiver spheric dipole antenna) 212, and are converted into an optical signal by a non-illustrated E/O converter incorporated in the measuring antenna 212. The optical signal is input to an O/E converter 223 in the measurement room 202 via a receiving optical fiber cable 204. The O/E converter 223 then converts back to an electric signal. Finally, the electric signal is received by the receiver 224, such as a spectrum analyzer.

Since the electromagnetic wave leaked from the cabinet 213 is measured by the above-mentioned manner, it is possible to examine and evaluate the electromagnetic shield characteristic of the cabinet 213.

The optical fiber cables 203, 204 serve to connect the oscillator 221 and transmitting antenna 214, the measuring antenna 212 and the receiver 224 so as to eliminate possible influence on the result of EMI measurement in the EMI measurement system 200. Namely, if an electrical cable, e.g. a coaxial cable substituting for the optical fiber cables 203, 204, the result of EMI measurement would be affected by the electromagnetic waves leaked from the electrical cable.

If the measurement object has a plurality of electronic circuit blocks accommodated in the cabinet 213, the all electronic circuit blocks and the cabinet have to be collected in the anechoic chamber 201 to perform EMI measurement in the EMI measurement system 100 of FIG. 8. But if the measurement object is a large-scale electronic device, such as an exchange, it is very difficult to dispose the measurement object on the turntable 111 and to perform the EMI measurement under the same condition as an actual installation environment.

In the conventional method, therefore, since efforts to reduce or eliminate EMI are made on many occasions after installation of an electronic device, the electronic device installation and EMI countermeasure would be expensive and time-consuming.

As a solution, the spheric dipole antenna of FIG. 9 is used as an electromagnetic wave source that emits electromagnetic waves resembling those of the electronic device, as disclosed in Japanese Patent Laid-Open Publication NO. HEI 5-333072. Measurements are performed on electromagnetic wave propagation characteristics both in the actual installation place and in the experimental site (e.g., the anechoic chamber 101) and on the electromagnetic wave emitted in the experimental site. And the distribution of EMI is estimated when the electronic device is installed in the actual installation place based on the result of the measurement.

In this prior art, since the EMI of an electronic device is estimated before the installation, it is possible to take a countermeasure against EMI in advance.

A manufacturing process (product development process) of an electronic device is assumed. The manufacturing process includes EMI measurement. Assumed that the manufacturing process is performed on a large-scale electronic device, such as an exchange, since an exchange accommodates a plurality of electronic circuit blocks and a complex cabinet, the respective parts tend to be developed in separated place and at separated time, as shown in FIG. 10.

More specifically, a cabinet model is manufactured in a cabinet design process 300 (Steps A1, A2), and the individual electronic circuit block models are manufactured in the respective circuit design processes 400 (Steps B1, B2) irrespective of the cabinet design process 300.

When the EMI measurement is performed on the model 113 in the EMI measurement system 100, the cabinet and the electronic circuit blocks, which are independently designed in the processes 300, 400, are collected in the anechoic camber 101 at the same time, and the model 113 is assembled using the cabinet and the electronic circuit blocks. Finally, the EMI measurement is performed on the model 113 (Steps C1, C2).

On the basis of the result of the EMI measurement, a countermeasure is taken on the cabinet and/or the electronic circuit blocks to meet the VCCI gauge: a cabinet product is designed (Step A3) in cabinet design process 300; and the debug operations to the model hardware and software, which operations are original purposes for the models, are performed on the respective electronic circuit blocks (Step B3); and the electronic circuit block products are designed (Step B4) in the respective circuit design process 400.

Upon the completion of the individual products (Steps A4, B5), the cabinet product and the all electronic circuit block products are collected again in the anechoic chamber 101 and are assembled (Step C3). Finally, EMI measurement is performed on the electronic device, which is going to be put on the market, as a whole (Step C4).

As a result, the cabinet and the electronic circuit blocks need to be collected in the anechoic chamber 101 in the conventional EMI measurement system 100 each time when EMI measurement is carried out. In particular, when EMI measurement is performed on a large-scale electronic device, such as an exchange, the EMI measurement causes a considerable load on the entire development process.

The electronic circuit block models are manufactured not only for EMI measurement but also mainly for the debug operations with respect to its hardware and software. But, as described above, the debug operations halt during EMI measurement (hatched part in FIG. 10).

Further, when the electronic device includes a plurality of electronic circuit blocks, as the above-mentioned example, and one of the electronic circuit blocks is modified in specification after the EMI measurement, the cabinet and the all electronic circuit blocks including, of course, unmodified electronic circuit blocks are re-collected, re-assembled, and re-performed the EMI measurement. In this case, the debug operations with respect to the unmodified electronic circuit blocks are also interrupted.

In particular, when manufacturing plants are decentralized in separated places for labor division, plural electronic circuit blocks unitedly constitute an electronic device are usually designed and developed in respective different places. In that case, it is very inefficient to collect all the electronic circuit blocks at a measurement site each time when EMI measurement is performed.

Upon EMI measurement, if electromagnetic waves resembling those of respective electronic circuit block is emitted in the anechoic chamber 101, so that it is possible to avoid such unreasonable operation. As a solution, it would be possible to realize electromagnetic waves emission resembling those of the electronic circuit blocks by using technique disclosed in Japanese Patent Laid-Open Publications No. HEI 5-333072 and No. HEI 6-43197.

These publications disclose a concept of "electromagnetic wave emission characteristic resembling those of an electronic device is emitted," however the concept simply reveals that a spheric dipole antenna is supposed to be an electromagnetic wave emitting source (electronic circuit). Additionally, the publications do not disclose or suggest a method or means for emitting electromagnetic waves exactly resembling those of an electronic device (electronic circuit block) in combination or respectively.

In particular, Japanese Patent Laid-Open Publication No. HEI 5-333072 discloses that "it is impossible for an emitting source to emit electromagnetic waves exactly resembling those of an electronic device" in the paragraph of [0007]. Further, since either one of the two publications does not aim to "emit electromagnetic waves exactly resembling those of an electronic device," it is obvious that the two publications fail to mention the method for exactly emitting electromagnetic waves resembling those of an electronic device.

In conclusion, even if the EMI measurement system 100 of FIG. 8 simply combines with the technique disclosed in the above-mentioned Japanese Patent Publications, it is impossible to emit electromagnetic waves resembling those of respective electronic circuits and to perform EMI measurement on an electronic device consists the electronic circuits without gathering the electronic circuits in the anechoic chamber 101.

SUMMARY OF THE INVENTION

With the foregoing problems in view, it is an object of the present invention to provide a system and a method for emitting electromagnetic waves exactly resembling those of an electronic circuit, which is an element of an electronic device.

Another object of the present invention is to provide a recording medium in which electromagnetic wave measurement control program is recorded for emitting electromagnetic waves exactly resembling those of an electronic circuit.

With the system, the method, and the recording medium, it is possible to perform electromagnetic wave measurement as if all electronic circuits constitute an electronic device are gathered, when the circuits are not collected.

To attain the first-named object, according to a first generic feature of the present invention, there is provided a system for measuring electromagnetic waves of an object electronic circuit, comprising: an electromagnetic wave emitting unit for emitting electromagnetic waves; an electromagnetic wave receiving unit, disposed relatively near to the electromagnetic wave emitting unit, for receiving the electromagnetic waves emitted by the electromagnetic wave emitting unit; measurement condition changing means for changing an electromagnetic wave measurement condition between the electromagnetic wave emitting unit and the electromagnetic wave receiving unit; an electromagnetic wave measuring unit, operatively connected with the electromagnetic wave receiving unit, for measuring the electromagnetic waves received by the electromagnetic wave receiving unit; and a control unit, operatively connected with the electromagnetic wave emitting unit and the measurement condition changing means, for controlling the electromagnetic wave emitting unit and the measurement condition changing means based on actual measurement data of the object electronic circuit, which data has previously been measured under a predetermined measurement condition, and measurement condition data of the predetermined measurement condition in such a manner that electromagnetic waves resembling those of the object electronic circuit is emitted from the electromagnetic wave emitting unit under the same condition as the predetermined measurement condition.

In the electromagnetic wave measuring system (hereinafter also called "measuring system"), obtaining the actual measurement data of the object electronic circuit, which data has previously been measured under a predetermined measurement condition, and the measurement condition data of the predetermined measurement condition (data obtaining step), the control unit controls the electromagnetic wave emitting unit and the measurement condition changing means based on the actual measurement data of the object electronic circuit and the measurement condition data of the predetermined measurement condition in such a manner that electromagnetic waves resembling those of the object electronic circuit is emitted from the electromagnetic wave emitting unit under the same condition as the predetermined measurement condition (controlling step), and measures the electromagnetic waves received by the electromagnetic wave receiving unit (measuring step).

As a result, since it is possible for the emitting unit to emit electromagnetic waves exactly resembling those of the object electronic circuit, the electromagnetic waves emitted from the electronic device can be measured using the resembling electromagnetic waves as substitution for electromagnetic waves actually emitted by the object electronic circuit even when the object electronic circuit is not at the measuring site.

Namely, since the control unit controls the current measurement condition and the electromagnetic wave emitting unit in electromagnetic wave emission state based on the actual measurement condition and the corresponding measurement condition data of the object electronic circuit in such a manner that the emitting unit emits electromagnetic waves exactly resembling those of the object electronic circuit, the electromagnetic waves emitted from the electronic device can be measured using the resembling electromagnetic waves as substitution for electromagnetic waves actually emitted by the object electronic circuit even when the object electronic circuit is not at the measuring site. Further, since it is possible to measure the electromagnetic waves emitted from the electronic device as if all the electronic circuits constitute the object electronic device are gathered at the same time even when the all electronic circuits are not gathered, it is possible to extremely improve the efficiency in the development process of the individual electronic circuits free from the development process of other electronic circuits.

To attain the second-named object, according to the third generic feature of the present invention, there is provided a recording medium in which an electromagnetic wave measurement control program for instructing a computer to execute processes including the data obtaining step and the controlling step. A computer reads the electromagnetic wave measurement control program and executes in accordance with the control program so as to control the electromagnetic wave measurement system and complete the electromagnetic wave measurement.

As a preferable feature of the present invention, the electromagnetic wave measurement control program may further instructs the computer to execute the steps of (b1) controlling the measurement condition changing means and the electromagnetic wave emitting unit in electromagnetic wave emission state in accordance with the measurement condition data and the actual measurement data so as to obtain electromagnetic-wave-emission-state data of the electromagnetic wave emitting unit when current measurement data of the electromagnetic waves received by the electromagnetic wave receiving unit coincides with the actual measurement data; and (b2) controlling the electromagnetic wave emitting unit in electromagnetic wave emission state in accordance with the electromagnetic-wave-emission-state data so as to render the electromagnetic wave emitting unit to emit intended electromagnetic waves resembling those of the object electronic circuit.

With these processes, the emitting unit emits electronic waves exactly resembling those of the object electronic circuit as if the object electronic circuit actually emits the electromagnetic waves.

Since the emitting unit in electromagnetic wave emission state is controlled in accordance with the electromagnetic-wave-emission-state data compensated in such a manner that the current measurement data of the electromagnetic waves received by the electromagnetic wave receiving unit coincides with the actual measurement data, it is further possible to emit electromagnetic waves exactly resembling those of the object electronic circuit with high accuracy.

As another preferable feature, the electromagnetic-wave-emission-state data, which has been obtained in the controlling step (b1), may be recorded in a storage unit. If an electronic circuit is changed in specification, the electromagnetic-wave-emission-state data with respect to other electronic circuits can be used as substitution for electromagnetic waves actually emitted from the respective electronic circuit as long as the specification, the measurement condition data, and the actual measurement data of the electronic circuit module are free from modification or changing.

Further, when the electromagnetic-wave-emission-state data is recorded in the storage unit, the electromagnetic-wave-emission-state data with respect to a modified-free electronic circuit can be reused. Namely, the electromagnetic-wave-emission-state data with respect to electronic circuits can be used as substitution for electromagnetic waves actually emitted from the respective electronic circuit as long as the specification, the measurement condition data, and the actual measurement data of the electronic circuit module are free from modification or changing. With the electromagnetic-wave-emission-state data stored in the storage unit, since, when the electromagnetic wave measurement is re-performed on a combination of a modified electronic circuit and modified-free electronic circuits, it is possible to perform the EMI measurement of the combination in the absence of the modified-free electronic circuit modules in the measurement site, it is possible to carry out respective development processed without affected by those of other electronic circuits.

As still another preferable feature, if said actual measurement data has been obtained over a frequency domain, the controlling step (b1) may includes the steps of performing an inverse Fourier transformation on said actual measurement data to obtain oscillated waveform data over a time domain; and producing an oscillated waveform of the electromagnetic wave emitted from the electromagnetic wave emitting unit based on the oscillated waveform data obtained by the inverse Fourier transform performing step. With such transformation performing and controlling process, since it is possible to control the emitting unit in electromagnetic wave emission state with respect to a plurality of frequencies included in the frequency domain of the actual measurement data only by a single signal input, the measurement operation can be streamline and simplified.

As an additional preferable feature, if there are provided a plurality of sets of the measurement condition data and the actual measurement data in accordance with a plurality of different measurement conditions, the control unit may control the measurement condition changing means and the electromagnetic wave emitting unit in electromagnetic wave emission state for the individual sets one after another in a predetermined sequence. With this manner, it is possible to emit electromagnetic waves resembling those of electronic circuit under plural measurement conditions with higher accuracy.

As still another preferable feature, if there are provided a plurality of sets of the measurement condition data and the actual measurement data, the control unit may further include data sorting means for sorting the plural sets of the measurement condition data and said actual measurement data into an order suitable for the measurement condition changing. With the data sorting means, since the electromagnetic wave measurement is performed in the most effective order, it is possible to further streamline and simplify the measurement operation.

Other objects and further features of the present invention will be apparent from the following detailed description when read in conjunction with the accompanying drawings.

BRIEF DESCRIPTION OF THE DRAWINGS

FIG. 3 is a table showing an example of module measurement data used in the EMI system of FIG. 1;

FIG. 4 is a flow diagram showing an algorithm for a control (EMI measurement control program; compensation process) performed by the control PC of FIG. 2;

FIG. 10 is a flow diagram showing a product development process to which conventional EMI measurement systems are applied.

DESCRIPTION OF THE PREFERRED EMBODIMENTS

A preferred embodiment of the present invention will now be described with reference to the accompanying drawings.

Figure 1:
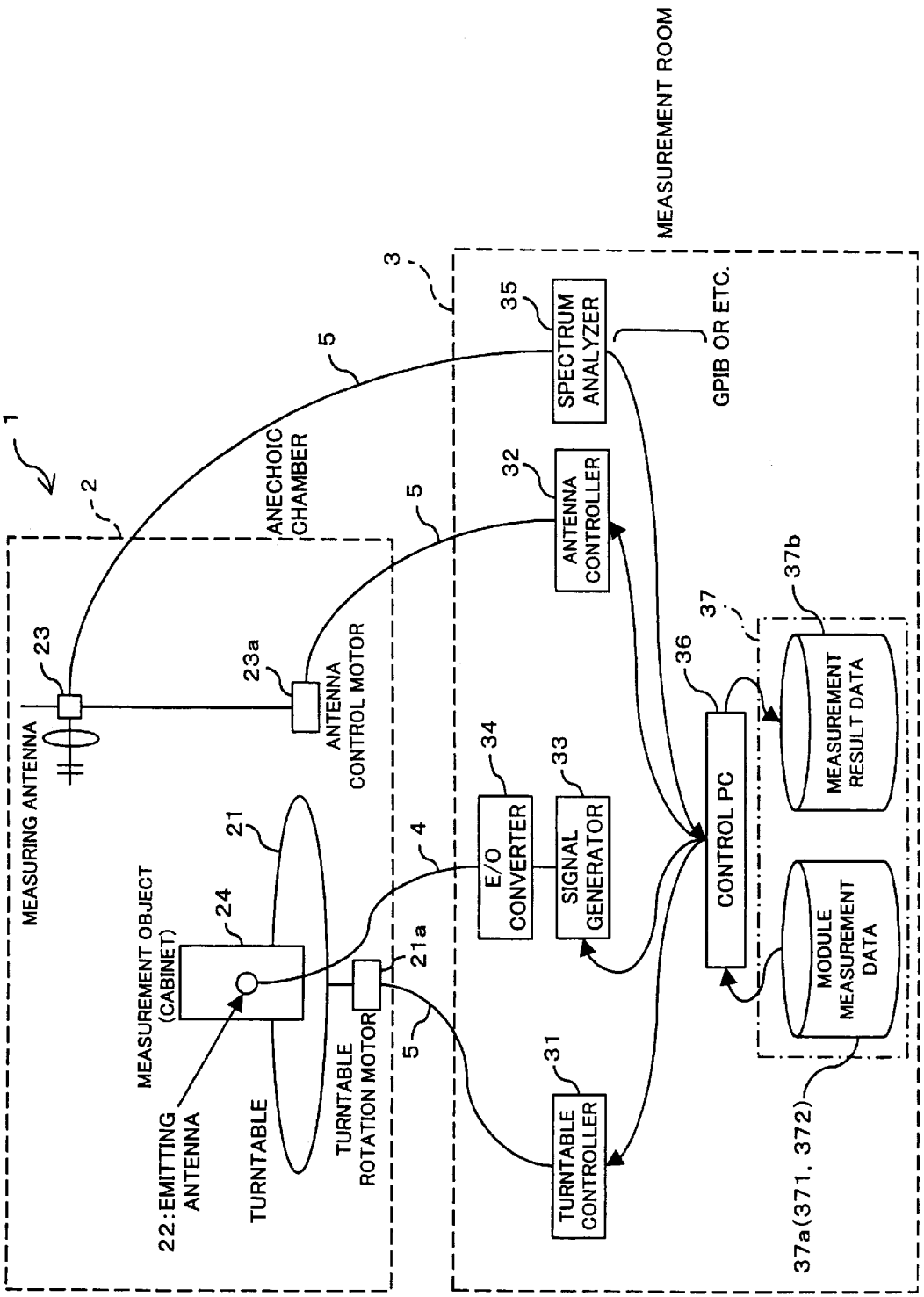
FIG. 1 is a block diagram schematically showing an EMI (electromagnetic interference) measurement system (an electromagnetic wave measurement system) according to an embodiment of the present invention.

(A) First Embodiment:

FIG. 1 is a block diagram schematically showing an EMI (electromagnetic interference) measurement system (an electromagnetic wave measurement system) according to an embodiment of the present invention. The EMI measurement system 1 includes a turntable 21 equipped with a turntable rotation motor 21a, an emitting antenna 22, and a measuring antenna 23 equipped with an antenna control motor 23a, which all elements are installed in an anechoic chamber 2 that is configured so as to eliminate reflection of electromagnetic wave. The EMI measurement system 1 also includes a turntable controller 31, an antenna controller 32, a signal generator 33, an electric/optical (E/O) converter 34, a spectrum analyzer 35, a control personal computer (PC) 36, and storage unit 37, which all elements are installed in a measurement room 3. The symbol 24 refers to a cabinet of an electronic device, which is an object for a final EMI measurement.

The emitting antenna 22 is connected with the E/O converter 34 by an optical cable (e.g., single-mode fiber) 4. Coaxial cables 5, which resist external noise, respectively connect the turntable controller 31 with the turntable rotation motor 21a, the antenna controller 32 and the antenna control motor 23a, and the spectrum analyzer 35 with the measuring antenna 23.

An electronic device or the cabinet 24, which are objects for EMI measurement, is disposed on the turntable 21. The turntable 21 angularly moves or rotates through 360 degrees about a vertical axis by controlling the turntable rotation motor 21a from the turntable controller 31. As a result, it is possible to an EMI measurement object, which is disposed on the turntable 21, is turned arbitrary directions within the horizontal plane.

The emitting antenna (electromagnetic wave emitting unit) 22 is disposed in the cabinet 24 of the electronic device of the final EMI measurement object, and the cabinet 24 is disposed on the turntable 21. The emitting antenna 22 emits electromagnetic waves in accordance with a signal (an oscillated waveform) produced by the signal generator 33, and is preferably exemplified by a spheric dipole antenna whose diameter is approximately 15 cm.

Non-illustrated optical/electric (O/E) converter and battery for emitting electromagnetic waves are incorporated into the emitting antenna 22. The incorporated O/E converter converts an oscillated waveform in the form of an optical signal, which is converted by the E/O converter 34 and is inputted into the emitting antenna 22 through the optical cable 4, to an electric signal and supplies the electric signal with its spheric conductor, thereby emitting non-directional electromagnetic waves from the spheric conductor. A lithium ion battery is preferably used in the emitting antenna because of its high energy density.

The measuring antenna (electromagnetic wave receiving unit) 23 receives the electromagnetic waves emitted by the emitting antenna 22. In the illustrated example, the antenna controller 32 controls the antenna control motor 23a in such a manner that the height of the measuring antenna 23 within the range of approximately from 1 meter to 4 meters in the vertical direction and the direction of the measuring antenna 23 is changed (e.g., vertical or horizontal).

The (horizontal) distance between a measurement object on the turntable 21 and the measurement antenna 23 is approximately 3 meters or 10 meters, which distances are preferably used in the art. The measurement antenna 23 is preferably exemplified by a biconical antenna within a frequency range of 30 MHz through 200 MHz, or a log-periodic antenna within a frequency range of 200 MHz through 1000 MHz. Since polarization directions of electromagnetic waves emitted from an electronic circuit are not uniform, the direction of the measurement antenna is changed so that the highest electronic field intensity is measured irrespective of the polarization direction.

The turntable controller 31 in the measurement room 3 controls the turntable rotation motor 21a in accordance with a turntable control signal (an angle of rotation) directed by the control PC 36 so as to rotate the turntable 21 at the directed angle of rotation. The antenna controller 32 controls the antenna control motor 23a in accordance with an antenna control signal directed by the control PC 36, thereby controls the direction (horizontal/vertical) and the height of the measurement antenna 23 as the antenna control signal directs.

Namely, the turntable controller 31, the turntable control motor 21a, the antenna controller 32, and the antenna control motor 23a unitedly function as a measurement condition changing unit for changing EMI measurement environment (condition) in the anechoic chamber 2.

The signal generator 33 generates an electric signal having an oscillated waveform corresponding to a direction (oscillated waveform data) from the control PC 36. The E/O converter 34 converts the electric signal generated by the signal generator 33 to an optical signal, which is provided for the emitting antenna 22 in the anechoic chamber 2 via the optical cable 4. The signal generator 33 is connected to the E/O converter 34 by a cable (e.g., coaxial cable 5) with low susceptibility to interference during transmission.

The spectrum analyzer 35 receives, via the coaxial cable 5, electromagnetic waves received (measured) by the measuring antenna 23, and analyzes the received electromagnetic wave so as to determine spectrum of the electromagnetic waves. The result of the analysis is sent to the control PC 36 via GPIB (General Purpose Interface Bus). The spectrum analyzer 35 analyzes electromagnetic waves in "highest intensity hold mode" or "entire intensities record mode". In the "highest intensity hold mode", only the highest intensities with respect to individual measurement frequencies are recorded during the EMI measurement over the particular frequency domain. On the other hand, in the "entire intensities record mode", all the measured intensities are recorded with respect to the all measurement frequencies. These modes are interchangeably set by a remote control of the control PC 36.

The storage unit 37 stores EMI measurement data (hereinafter also called "module measurement data") 37a with respect to individual electronic circuit module blocks constitute an electronic device of the final EMI measurement object. The storage unit 37 also stores measurement result data 37b (electric field intensities of electromagnetic waves measured by the measurement antenna 23), which is determined based on the result of the analysis performed by the spectrum analyzer 35.

Figure 2:
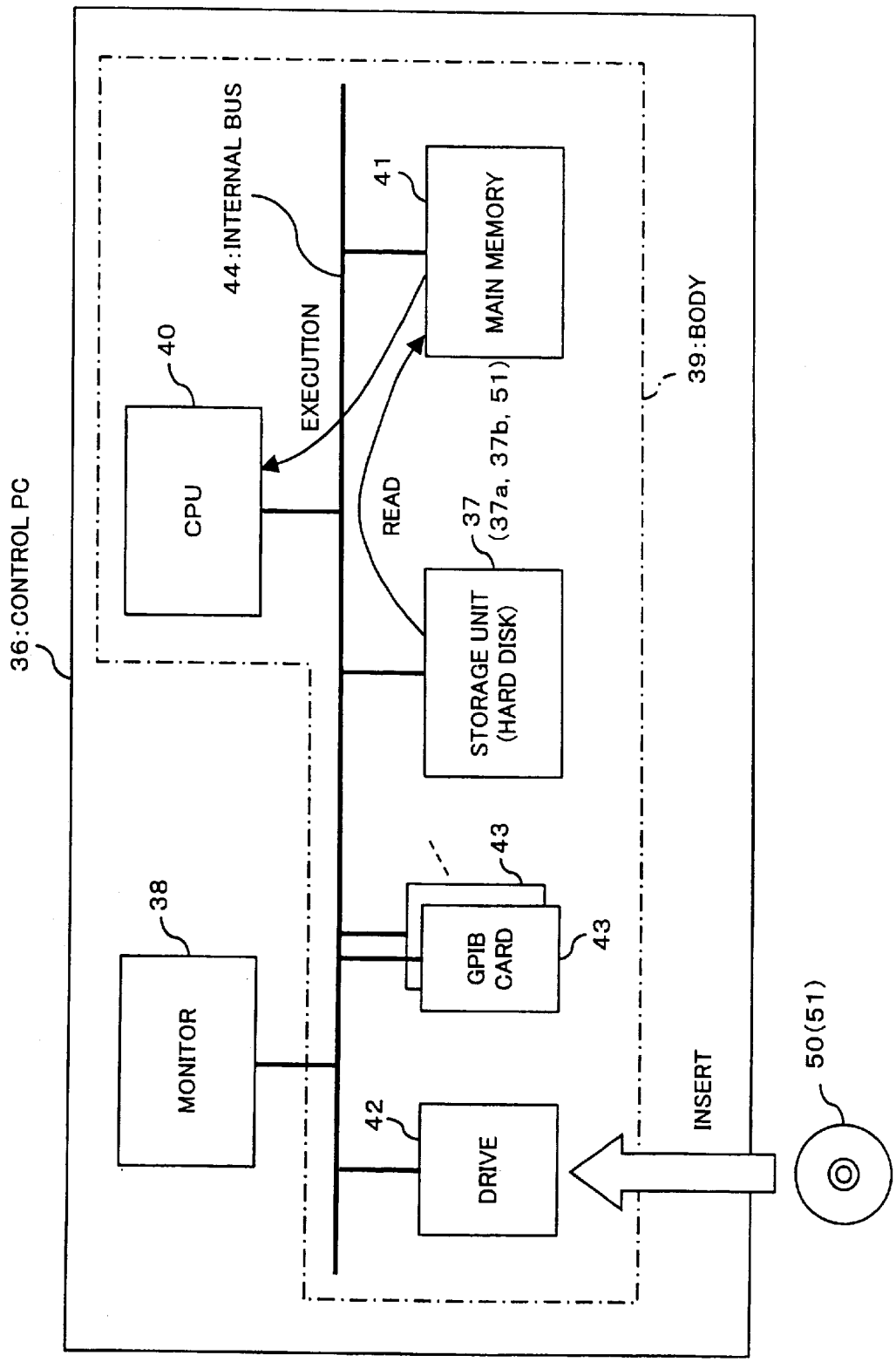
FIG. 2 is a block diagram schematically showing an example of a hardware configuration of a control PC in the EMI system of FIG. 1.

The storage unit 37 is in the form of an external memory in the FIG. 1. In alternative, the storage unit 37 may, of course, be an internal hard disk included in the control PC (FIG. 2). As described later with reference to FIG. 3, the storage unit 37 stores sets of electric field intensity data (actual measurement data) 372 of electromagnetic waves emitted by an electronic circuit module block at individual particular frequencies and measurement condition data 371 corresponding to the each actual measurement data. The measurement condition data 371 includes the angle of rotation of the turntable, the height of the measurement antenna, and the direction of the measurement antenna (horizon/vertical).

The control PC (control unit) 36 remote-and centralized-controls the turntable controller 31, the antenna controller 32, the signal generator 33, and the spectrum analyzer 35 with respective data communication via GPIB or etc so as to centralized-control the EMI measurement in the EMI measurement system 1 in the illustrated example.

Focused on the hardware configuration of the control PC 36 with reference to FIG. 2, the control PC 36 comprises a monitor 38, and a body 39. The body 39 includes the storage unit 37 in the form of a hard disk, a CPU 40, a main memory 41, a drive 42 suitable for a recording medium 50 (e.g., a floppy disk (FD), a CD-ROM, a magnet optical disk (MO)). Further, a GPIB card 43 is installed on an expansion bus slot in the body 39, and the GPIB card 43 is used for respectively connecting the control PC 36 with the turntable controller 31, the antenna controller 32, the signal generator 33, and the spectrum analyzer 35 via the GPIB or etc. The all hardware elements are communicably connected by an internal bus 44.

The CPU 40 centralized-manages operations performed by the control PC 36. Specifically, the CPU 40 loads a desired program, which has been stored (installed) in the hard disk 37, into the main memory 41 to run the desired program in accordance with a user's direction so as to instruct the control PC 36 to execute operations as the program instructs. For example, it is possible for the control PC 36 to function as an EMI measurement control unit by instructing the CPU 40 to execute an EMI measurement control program (hereinafter also simply called "control program") 51, which has been installed in the hard disk 37.

The control program 51 may be installed in the hard disk 37 in such a manner that the drive 42 reads the control program 51 stored in the recording medium 50, or that the control program 51 is downloaded via ftp (file transfer protocol) through a communication network, such as Internet, a WAN (Wide Area Network), or LAN (Local Area Network), and loading the control program 51 into the hard disk 37. In alternative, the control program 51 may be coded on the control PC 36 and may be loaded into the hard disk 37 to install the control program 51.

When the CPU 40 runs the control program 51, the control PC 36 executes algorithms (data compensation process 52 and measurement process 53) as described later with reference to FIGS. 4, 5. Namely, the control program 51 of the illustrated example is coded so as to render the control PC 36 to perform the processes 52, 53 shown in FIGS. 4, 5.

An operation performed in the EMI measurement system 1 having the above-mentioned elements will now be described.

Figure 8:
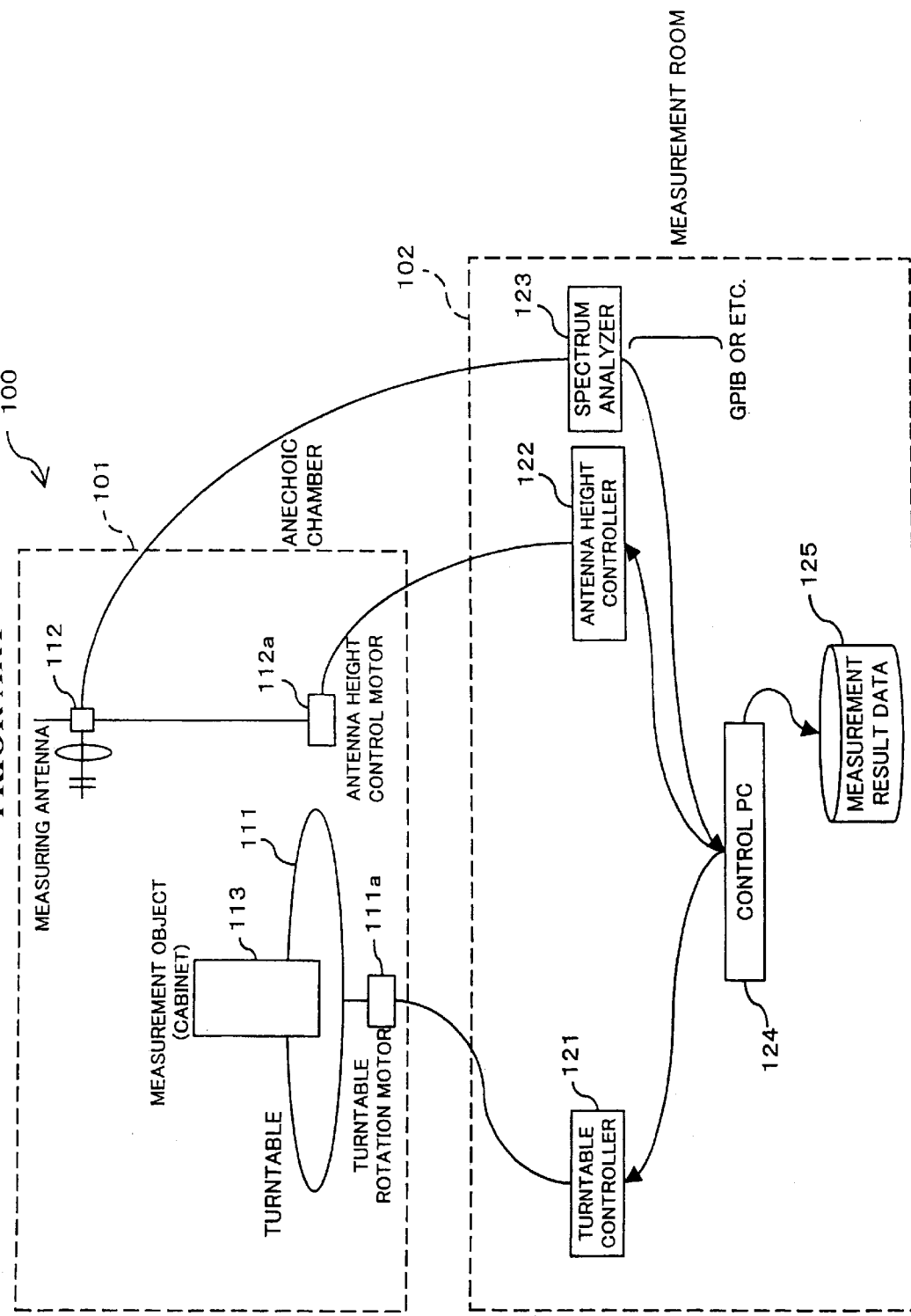
FIG. 8 is a block diagram schematically showing a conventional EMI measurement system.

First of all, it is necessary to obtain the module measurement data 37*a* with respect to individual electronic circuit module blocks. The module measurement data 37*a* may be obtained by a measurement using the EMI measurement system 1 of the illustrated embodiment or the conventional measurement system 100 of FIG. 8.

When the module measurement data 37*a* is obtained using the EMI measurement system 1, the control PC is previously installed a program (different from the control program 51; and hereinafter called "element control program") for automatically controlling the turntable controller 31, the antenna controller 32, and the spectrum analyzer 35 into. The element control program may be provided by a measurement device manufacturer or the like, or may be created by a common programming language (e.g., C language, or BASIC). In either case, the element control program may be commonly used by the conventional system 100.

An electronic circuit module block constitutes an electronic device of the final EMI measurement object is placed on the turntable 21 as a current measurement object, and the electronic circuit module block is started (powered on). The control PC 36 initializes the measurement condition (angle of rotation of turntable: 0 degree; height of antenna: 1m; and direction of antenna: horizon) and sets the spectrum analyzer 35 in a suitable measurement mode ("entire intensities record mode") by running the element control program with the electronic circuit module block powered on.

In the entire intensities record mode, the spectrum analyzer 35 analyzes electric field intensities for each frequencies in a frequency domain under the measurement condition, whereupon the result of analysis (the highest electric field intensities) is sent to the control PC 36. The control PC 36 records, in the hard disk 37, a set of the module measurement data 37*a* (the angle of rotation of turntable, the height of antenna, and the direction of antenna), the frequency, and the electric field intensity corresponding to the frequency. When the module measurement data 37*a* is stored in a text format exemplified by "360, 4.0, H, 1000.0, −100.0", the size of the module measurement data 37*a* is approximately 24 bytes.

After the EMI measurement under the initial measurement condition, each one of the angle of the rotation of turntable, the height of antenna, and the direction of antenna is sequentially changed, the combinations of a frequency and a corresponding electronic field intensity are respectively measured under the all measurement conditions, and are stored in the hard disk 37. FIG. 3 is a table showing an example of the module measurement data 37*a*. At that time, the result of the EMI measurement is recorded in the "entire intensities recording mode", in which respective sets of the recorded electric field intensity data 372 including the angle of rotation of turntable, the height of antenna, the direction of antenna, the frequency, and the electric field intensity corresponding to the frequency under the respective measurement condition, not in ordinary the "highest intensity hold mode", in which only the highest electronic field intensity is recorded.

The module measurement data 37*a* has to be measured between 0 and 360 degrees in the angle of rotation of the turntable at intervals of at least 5 degrees and between 1 meter and 4 meters in the height of the antenna at intervals of at least 0.5 meter, as shown in FIG. 3, in such a manner that electromagnetic waves is accurately simulated those of the electronic circuit module block using the module measurement data 37*a* as described later. With such a measurement condition, the number of the measurement condition sets is 504. And since a direction of the antenna has two alternatives of "horizon" and "vertical", the total number of the measurement condition sets is 1008.

The electronic field intensities peculiar to individual frequencies, which intensities are analyzed by the spectrum analyzer 35, suffice EMI measurement over a frequency domain in steps of approximately 1%. The analysis suffices in the range from 30 to 100 MHz in steps of 0.3 MHz; in the range from 100 to 300 MHz in steps of 1 MHz; and in the range from 300 to 1000 MHz in steps of 3 MHz. As a result, the spectrum analyzer 35 measures the electronic field intensities at approximately 670 frequencies. The frequency domain between 300 and 1000 MHz (1 GHz) is commonly used in the art because of regulations in various countries.

The EMI measurement under such measurement condition sets takes time dependently on performance of respective measurement unit, i.e., the turntable controller 31, the antenna controller 32, and the spectrum analyzer 35. The measurement under a single measurement condition set takes approximately 10 seconds considering time for the analysis in the spectrum analyzer 35, data transfer from the spectrum analyzer 35 to the control PC 36, changing of an angle of rotation of the turntable 21, the height and the direction of the measuring antenna 23. Therefore, the measurement under the all measurement condition sets takes approximately 2 hours and 50 minutes.

The module measurement data 37a, which has been recorded by the above-mentioned procedure, is dedicated to the future EMI measurement using electromagnetic waves resembling those of the electronic circuit block module blocks, which electromagnetic waves emitted by the emitting antenna 22. When the module measurement data 37a is measured and recorded in the conventional system 1, the module measurement data 37a has to be sent to the control PC 36.

Since the size of the module measurement data 37a with respect to an electronic circuit module block is approximately 16 MB (mega bytes) when the data is recorded in the form of the text format, the data may be stored in a mass storage, such as a CD-ROM or MO, or may be transferred via ftp through a communication network, such as Internet.

The EMI measurement with respect to the electronic device of the final EMI measurement object will be performed using the module measurement data 37a by emitting electromagnetic waves resembling those of the individual electronic circuit module block from the emitting antenna 22; an oscillated waveform (amplitude) of the signal generator 33 has to be obtained before the final EMI measurement so as to cause the emitting antenna 22 to emit electromagnetic waves having electric field intensities resembling those of electromagnetic waves emitted from the electronic circuit module block.

The process for obtaining the oscillated waveform (data compensation process 52) will now be described with reference to a flow diagram of FIG. 4. Throughout the data compensation process, only the emitting antenna 22 without the cabinet 24 is disposed on the turntable 21 in the anechoic chamber 2. The distance between the emitting antenna 21 and the measuring antenna 23 should be, of course, identical with the distance between an electronic circuit module block on the turntable 21 and the measurement antenna 23 upon the measurement of the module measurement data 37a of the electronic circuit module block.

The control PC 36 (CPU 40) starts the data compensation process 52 by execution of the control program 51. First of all, the control PC 36 reads the module measurement data 37a from the hard disk 37 (module measurement data reading step: Step S1). As mentioned above, the module measurement data 37a contains the measurement condition data 371 (i.e., angle of rotation of turntable, height of antenna, and direction of antenna) and the electronic field intensity data 372 (i.e., frequency, and corresponding electric field intensity). Namely, the control program 51 instructs the control PC 36 (CPU 40) to function as a data obtaining section 61 for obtaining the module measurement data 37a.

If the sets of the module measurement data 37a are arranged irregularly with respect to a height of the antenna or an angle of rotation of the turntable, the measurement may take additional time because of inefficient measurement condition changing. As a solution, the control PC 36 rearranges the sets of the module measurement data 37a into the order as shown in FIG. 3 (the height of the antenna is arranged from the lowest through the highest; and the angle of rotation of the turntable is from 0 to 360 degrees) so that the streamlined measurement is carried out with the highest efficiency (module measurement data sort step: Step S2) At that time, the control program 51 instructs the control PC 36 (CPU 40) to function as a data sorting section 63 for sorting the plural sets of the electric field intensity data 372 and the measurement condition data 371 into an order suitable for the measurement condition changing.

Figure 6:
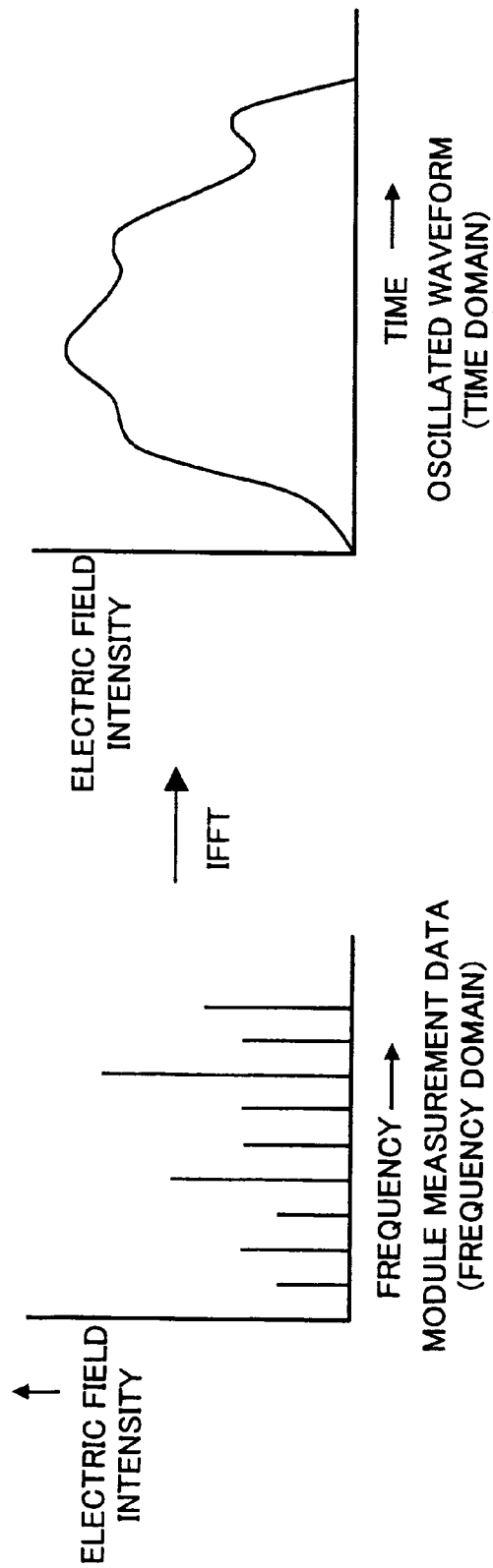
FIGS. 6A, 6B are diagrams unitedly showing an inverse Fourier transformation performed on the module measurement data of FIG. 3, and respectively showing examples of the module measurement data over a frequency domain before the inverse Fourier transformation and oscillated waveform data over a time domain after the transformation.

Since the electric field intensity data 372, which is recorded in the hard disk 37, is corresponding to respective frequency within a particular frequency domain (FIG. 6A), it is impossible for the electric field intensity data 372 over the frequency domain to provide the emitting antenna 22 with a signal. Therefore, an inverse fast Fourier transformation (IFFT) is performed on the electric field intensity data 372 to obtain electric field intensity data corresponding to time, i.e., oscillated waveform data over a time domain (FIG. (6B) ) (IFFT and waveform producing step: Step S3).

The control program 51 instructs the control PC 36 (CPU 40) to functions as, if the electric field intensity data 372 has been obtained over a frequency domain, an inverse fast Fourier transformation performing section 64 for performing an inverse fast Fourier transformation on the data 372 to obtain the oscillated waveform data over a time domain and an oscillated waveform producing section 65 for producing the oscillated waveform of the electromagnetic waves emitted from the emitting antenna 22 based on the oscillated waveform data obtained by the inverse fast Fourier transformation performing section 64.

The measurement operation can be streamlined, since it is possible to control the emitting antenna 22 in electromagnetic wave emission state all at once by providing the signal generator 33 with the oscillated waveform corresponding to the electric field intensity data 372 at a plurality of frequencies over the particular frequency domain (e.g., 30 MHz through 1000 MHz), on which an inverse fast Fourier transformation has been performed, at once. The inverse fast Fourier transformation may be performed by software on the control PC 36, or by hardware, such as a synthesizer. Considering performance of the recent PCs, it is reasonable to process by software than to install dedicated hardware.

Subsequently, the control PC 36 controls the turntable controller 31 and the antenna controller 32 in accordance with the measurement condition data 371 in the first set (n=1) of the module measurement data 37a to control a height of the antenna 23, a direction of the antenna 23, and an angle of rotation of the turntable 21 as the data 371 directs (Steps S4, S5). Under the first set of the measurement condition 371, the oscillated waveform, which has been generated in the above-described manner, is inputted into the signal generator 33 in such a manner that an electric signal having the oscillated waveform is oscillated in an appropriate amplitude, at first (waveform inputting and oscillate starting step: Steps S6, S7).

Responsive to the input of the oscillated waveform, the emitting antenna 22 emits electromagnetic waves corresponding to the oscillated waveform. The measurement antenna 23 measures the electromagnetic wave, which has been emitted by the emitting antenna 22, whereupon the spectrum analyzer 35 analyzes the measured electromagnetic wave. The control PC 36 receives the result of analysis, obtains an electric field intensity, and records the intensity in the hard disk 37 or in the main memory 41 (received intensity measurement step: Step S8).

The control PC 36 compares the measured (recorded) electric field intensity and the electric field intensity 372 included in the first (n=1) set of the module measurement data 37a: the oscillate electric signal is increased in amplitude if the measured (recorded) electric field intensity is higher than the electric field intensity 372; or the oscillate electric signal is decreased in amplitude if the measured (recorded) electric field intensity is lower than the electric field intensity 372. A suitable amplitude is obtained by changing the waveform in amplitude one after another in the above-described manner (amplitude deciding step: Step S9) so that the measuring antenna 23 measures electronic waves identical in electric field intensity with that of the module measurement data 37a. A set of the waveform having the suitable amplitude and nth measurement condition data 371 (current measurement condition) is recorded in the hard disk 37, as electromagnetic-wave-emission-state data (amplitude recording step: Step S10).

The control program 51 instructs the CPU 40 to execute the operations in Steps S2 through S10, as shown in FIG. 4. More specifically, the control program 51 renders the control PC 36 (CPU 40) to control the controllers 31, 32 and the emitting antenna 22 in electromagnetic wave emission state in accordance with the measurement condition data 371 and the electric field intensity data 372, which have been obtained by the data obtaining section 61, in such a manner that the control PC 36 functions as a data compensation section 62 for obtaining the electromagnetic-wave-emission-state data of the emitting antenna 22 when measurement data of the electromagnetic waves received by the measuring antenna 23, which data is analyzed by the spectrum analyzer 35, coincides with the electric field intensity data 372. Further, the control program 51 also instructs the control PC 36 to function as an electromagnetic-wave-emission-state data recording section 66 for recording the electromagnetic-wave-emission-state data obtained by the data compensation section 62.

It is possible to obtain the suitable amplitude of the oscillated waveform by measurement using a waveform at a single frequency and succeeding arithmetic operations, if the relationship between the amplitude and the electric field intensity is obtained by previous measurement or etc. Although it is preferable that the suitable amplitude is verified by measuring electromagnetic waves actually emitted by the emitting antenna 22 as the illustrated example so that the suitable amplitude is obtained with accuracy. The above-mentioned data compensation process is sequentially performed on the all set of a height of antenna, a direction of antenna, and an angle of rotation of the turntable in the measurement condition data 371 one after another (NO route in Step S11) to obtain the suitable amplitude with respect to all sets of the module measurement data 37a. Namely, the control PC 36 reads the succeeding set of the module measurement data 37a (n=n+1, Step S12) until it is discriminated that data compensation with respect to the last set of the data 37a is completed (YES route in Step S11).

If there are provided a plurality sets of the measurement condition data 371 and the electric field intensity data 372 in accordance with a plurality of different measurement conditions, the control program 51 controls the measurement conditions and the emitting antenna in electromagnetic wave emission state for the individual sets one after another in a predetermined sequence when the control program 51 instruct the control PC 36 to function as the data compensation section 62. As a result, since it is possible to render the emitting antenna 22 to emit intended electromagnetic waves resembling those of the electronic circuit module block in all direction (under the plural measurement conditions), the electromagnetic waves is resembled those of the electronic circuit module block with highly accuracy.

The signal generator produces an electric signal having the recorded waveform in the suitable amplitude under the corresponding measurement condition, whereupon the emitting antenna 22 emits the electromagnetic waves resembling those of the electronic circuit module block. And if there are provided a plurality of electronic circuit module blocks, the control PC 36 records the waveforms and suitable amplitudes corresponding to individual blocks.

Figure 5:
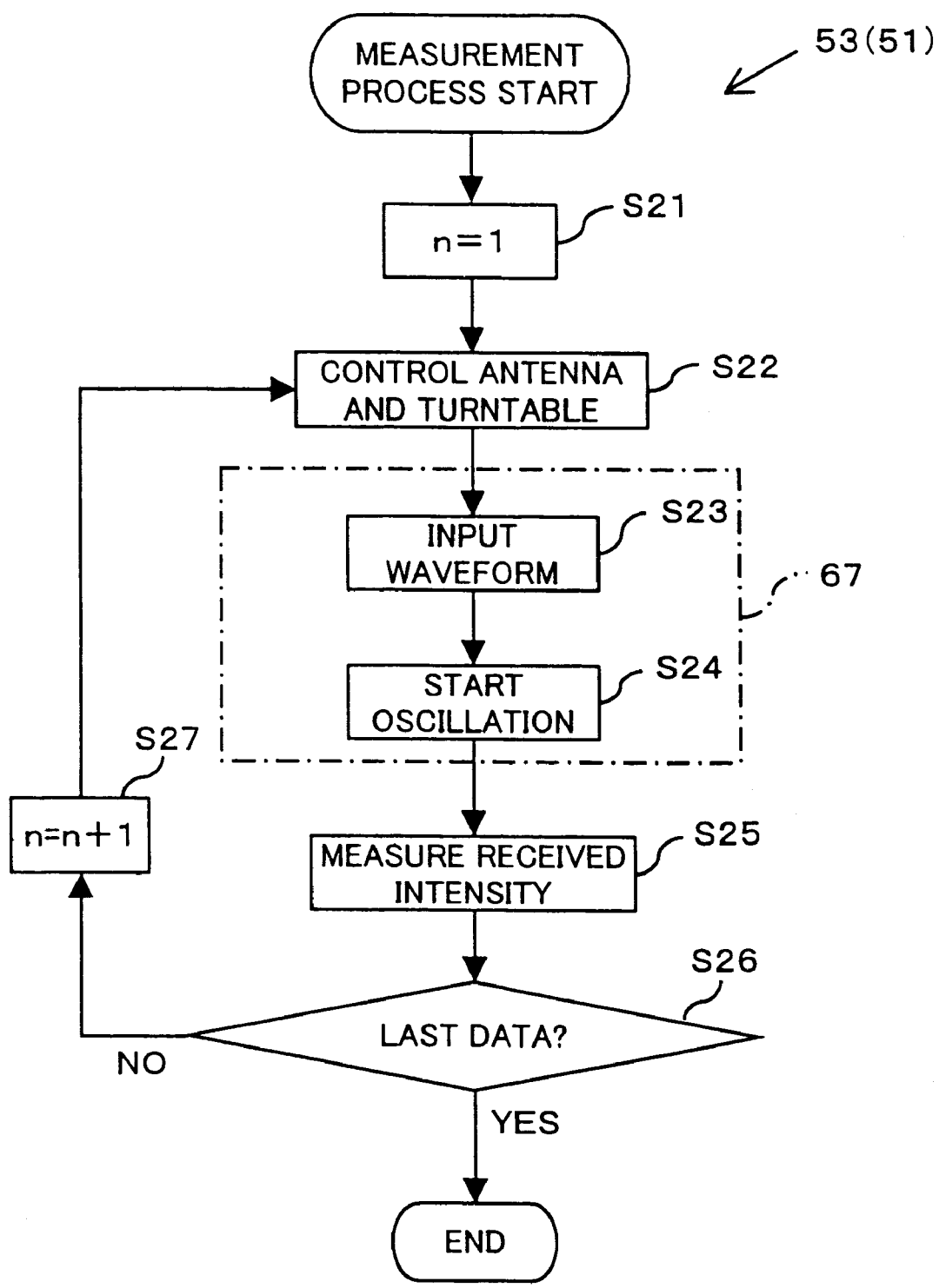
FIG. 5 is a flow diagram showing an algorithm for a control (EMI measurement control program; measurement process) performed by the control PC of FIG. 2.

After the data compensation process 52, the final measurement EMI (measurement process 53: control step) is carried out in accordance with an algorithm of FIG. 5. In the measurement process, the emitting antenna 22 is disposed in the cabinet 24 on the turntable 21, as shown in FIG. 1. If there are provided a plurality of electronic circuit module blocks, a plurality of emitting antennas 22 as many as the plural electronic circuit module blocks are disposed in the cabinet 24.

At first, the control PC 36 controls a height of antenna, a direction of antenna, and an angle of rotation of the turntable in accordance with the first (n=1) the electromagnetic-wave-emission-state data (the measurement condition, the waveform, and the suitable amplitude), which has been obtained in the data compensation process 52 (Steps S21, S22). Then the control PC 36 inputs the waveform and the amplitude corresponding to the first electromagnetic-wave-emission-state data to the signal generator 33 (Step S23), whereupon renders the emitting antenna 22 to emit (oscillate) electromagnetic wave resembling those of the electronic circuit module block (Step S24).

At that time, the control program 51 instructs the control PC 36 to function as an electromagnetic-wave-emission-state control section 67 by causing the CPU 40 to execute Steps S23, S24, as an "electromagnetic-wave-emission-state control process". The electromagnetic-wave-emission-state control section 67 renders the emitting antenna 22 to emit electromagnetic waves resembling those of the electric circuit module block by controlling the emitting antenna 22 in electromagnetic wave emission state in accordance with the data obtained by the data compensation section 62.

The control PC 36 reads electric field intensities of the electromagnetic waves measured by the measuring antenna 23 via the spectrum analyzer 35 and records the intensities in the hard disk 37 or etc. (measurement step: Step S25).

The above-mentioned measurement process is sequentially performed on the all set of a height of antenna 23, a direction of antenna 23, and an angle of rotation of the turntable 21 one after another to obtain and record the EMI of the electronic circuit module block covered with the cabinet 24 in all directions by using electromagnetic waves resembling those of the module measurement data 37a in the electronic circuit module block. Namely, the control PC 36 reads the succeeding set of the module measurement data 37a in the electromagnetic-wave-emission-state data (n=n+1, NO route of Step S26: Step S27) until it is discriminated that measurement with respect to the last set of the electromagnetic-wave-emission-state data is completed (YES route of Step S26). In the measurement process, recorded data suffices only the highest electric field intensities for individual frequencies (in the "highest intensity holding mode"), however, a height of antenna, a direction of antenna, and an angle of rotation of the turntable, which are recorded in the data compensation process, do not have to be recorded in the measurement process.

In the EMI measurement system 1 of the illustrated embodiment, it is possible for the emitting antenna 22 to emit electromagnetic waves resembling those of the electronic circuit module block with higher accuracy by controlling the current measurement condition and the emitting antenna 22 in electromagnetic wave emission state based on the actual measurement data 372 of the electromagnetic waves emitted from the electric circuit module block and the corresponding measurement condition data 371. As an advantageous result, it is possible to measure EMI of the object electronic device by using such resembling electromagnetic waves even if the electronic circuit module block is not disposed on the turntable 21 in the anechoic chamber 2.

Namely, even if all the electronic circuit module blocks constitute the object electronic device are not disposed in the anechoic chamber 2 at the same time, it is possible to measure the EMI of the object electronic device as well as when the all elements of the electronic device are collected at the same time. Partly since the EMI measurement is performed on individual models of the respective electronic circuit module blocks in accordance with respective development process, partly since the measurement of the model electronic device is executed using the results of EMI measurement of the individual module block model, it is possible to extremely improve the efficiency in the development process of the individual products free from the aggregated EMI measurement of the object electronic device.

Figure 7:
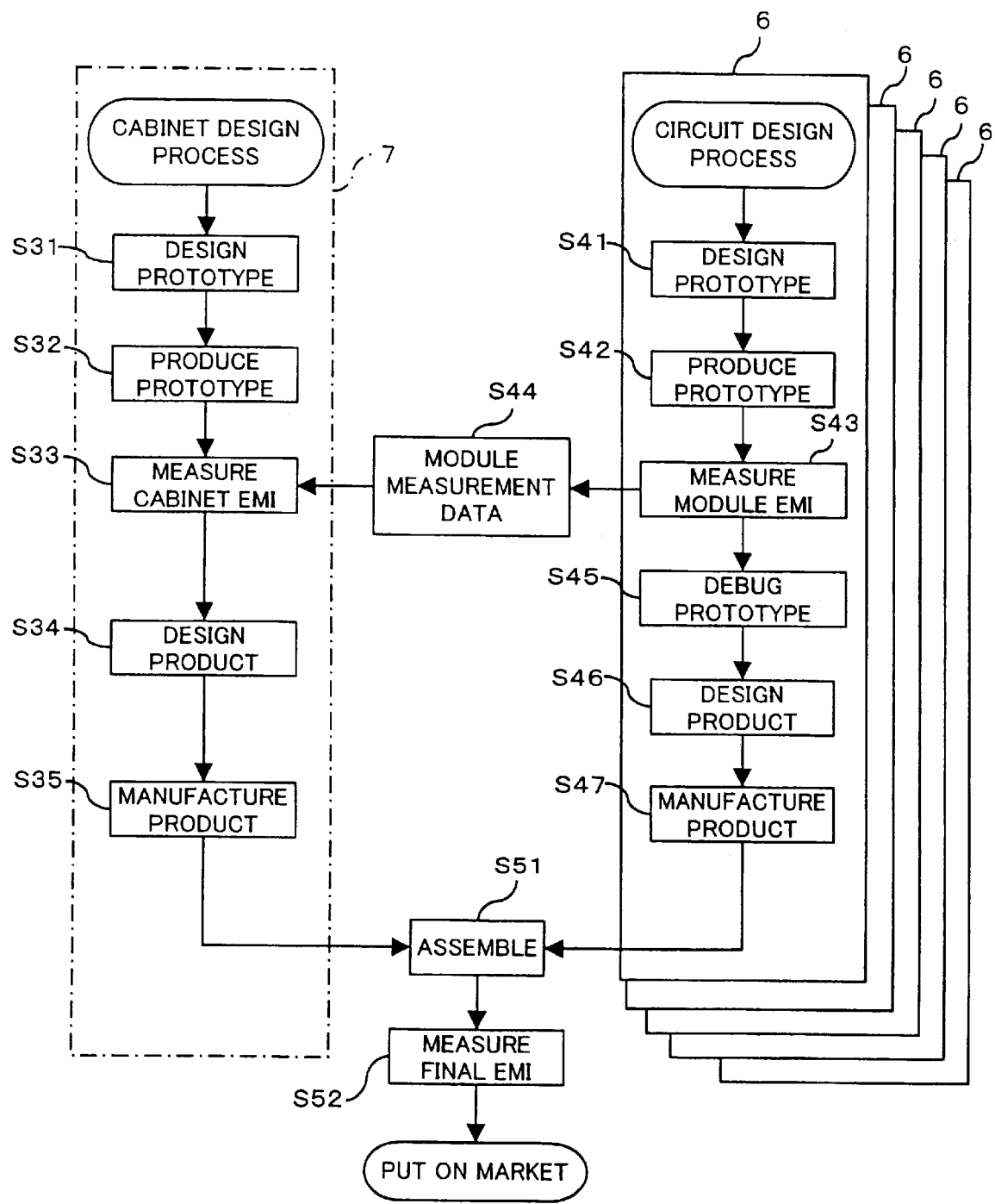
FIG. 7 is a flow diagram showing a product development process to which the EMI measurement system of FIG. 1 is applied.

In the product development process, for example, a cabinet (24) model is designed in a cabinet design process 7 (Steps S31, S32), and respective electronic circuit module block models are designed in individual circuit design process 6 (Steps S41, S42), which are separated from the cabinet design process 7, as shown in FIG. 7.

In the respective circuit design process 6, the EMI of the individual electronic circuit module block model is measured to obtain the module measurement data 37a (Step S43). The data compensation process 52 is performed on the module measurement data 37a for the respective module block, whereupon the compensated module measurement data 37a is used for the EMI measurement with the cabinet 24 (Steps S44, S33). Since the debug operations to the model hardware and software are continuously performed in the circuit design process 6 during the EMI measurement (Step S45), it is possible to design and manufacture products without time delay (Steps S46, S47).

In the meanwhile, if the result of the EMI measurement of FIG. 5 suffices the gauge about the EMI, the cabinet design process 7 starts designing and the manufacturing the cabinet (24) product (Steps S34, S35). Upon completion of manufacturing of the cabinet and circuit products, the cabinet product and the electronic circuit module block products are collected in the anechoic chamber 2 to assemble the object electronic device (Step S51). Then the final EMI measurement is performed on the object electronic device, which is going to be put on the market (Step S52).

In the illustrated EMI measurement system 1, the cabinet 24 and all the electronic circuit module blocks do not need to be collected in the anechoic chamber 2 each time when the EMI measurement is performed on the model of the object electronic device. As a result, it is possible to streamline and simplify the development process of also a large-scale electronic device, such as an exchange.

Further, the control PC 36 controls the emitting antenna 22 in electromagnetic wave emission state in accordance with the electromagnetic-wave-emission-state control data (the oscillated waveform and the corresponding amplitude), which has been compensated in the data compensation process 52 in such a manner that the measurement data of electromagnetic waves measured by the measuring antenna 23 coincide with the previously measured actual measurement data 372. As a result, since the electromagnetic waves emitted by the emitting antenna 22 further resembles those of the electronic circuit module block, it is possible for the emitting antenna 22 to emit electromagnetic waves precisely resembling those of the individual electronic circuit module.

If one of the electronic circuit modules constitute the object electronic device is modified in specification, it is possible to use the electromagnetic-wave-emission-state data of other electronic circuit modules free from the modification because the electromagnetic-wave-emission-state data obtained by the data compensation process 52 is stored in the hard disk 37 or etc.

Namely, once the EMI measurement system 1 obtains the data (the electromagnetic-wave-emission-state data) with respect to electromagnetic waves of the electronic circuit module, the electromagnetic-wave-emission-state data can be used as data on the actual electromagnetic waves of the electronic circuit module as long as the specification, the measurement condition data 371, and the actual measurement data 372 of the electronic circuit module are free from modification or changing.

With the electromagnetic-wave-emission-state data stored in the hard disk 37, when the EMI measurement is re-performed on a combination of a modified electronic circuit module and modified-free electronic circuit modules, it is possible to perform the EMI measurement of the combination in the absence of the modified-free electronic circuit modules in the anechoic chamber 2. Since the development process of an electronic circuit module is not affected by those of other electronic circuit modules, it is possible to streamline the development process of the individual electronic circuit module as a whole.

(B) Others:

When the sets of the module measurement data 37a are originally arranged in an order suitable for the measurement condition changing, the module data sort step S2 in the FIG. 4 can be, of course, omitted. The items in the measurement condition should be, of course, by no means limited to items described in FIG. 3; alternatively, the items may be altered in accordance with types of the measuring antenna 23 and turntable 21.

Figure 9:
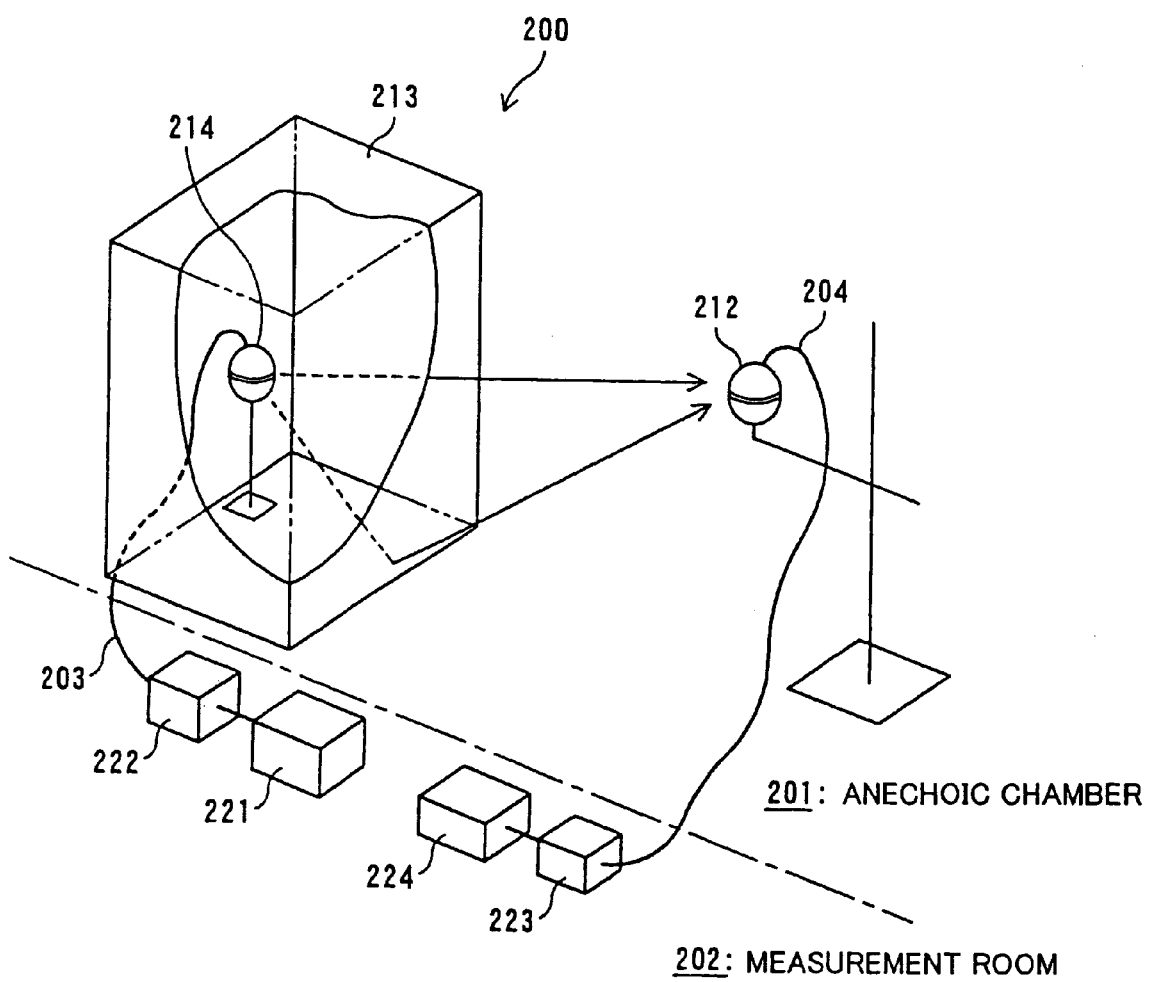
FIG. 9 is a diagram schematically showing a conventional electromagnetic shield characteristic measurement system.

In the illustrated example, the coaxial cable 5 connects the measurement antenna 23 and the spectrum analyzer 35. In alternative, a spheric dipole antenna may be used as the measurement antenna and optical cable may connect the measurement antenna 23 and the spectrum analyzer 35, likewise the conventional EMI measurement system 200 of FIG. 9.

Further, the present invention should by no means be limited to the foregoing embodiment, and various changes or modifications may be suggested without departing from the gist of the invention.

What is claimed is:

1. A system for measuring electromagnetic waves of an object electronic circuit, comprising:

an electromagnetic wave emitting unit for emitting electromagnetic waves;

an electromagnetic wave receiving unit, disposed relatively near to said electromagnetic wave emitting unit, for receiving the electromagnetic waves emitted by said electromagnetic wave emitting unit;

measurement condition changing means for changing an electromagnetic wave measurement condition between said electromagnetic wave emitting unit and said electromagnetic wave receiving unit;

an electromagnetic wave measuring unit, operatively connected with said electromagnetic wave receiving unit, for measuring the electromagnetic waves received by said electromagnetic wave receiving unit; and a control unit, operatively connected with said electromagnetic wave emitting unit and said measurement condition changing means, for controlling said electromagnetic wave emitting unit and said measurement condition changing means based on actual measurement data of the object electronic circuit, which data has previously been measured under a predetermined measurement condition, and measurement condition data of said predetermined measurement condition in such a manner that electromagnetic waves resembling those of the object electronic circuit is emitted from said electromagnetic wave emitting unit under the same condition as said predetermined measurement condition.

2. An electromagnetic wave measuring system according to claim 1, wherein said control unit includes:

data obtaining means for obtaining said measurement condition data and said actual measurement data;

data compensation means for controlling said measurement condition changing means and said electromagnetic wave emitting unit in electromagnetic wave emission state in accordance with said measurement condition data and said actual measurement data, which have been obtained by said data obtaining means, so as to obtain electromagnetic-wave-emission-state data of said electromagnetic wave emitting unit when current measurement data of the electromagnetic waves received by said electromagnetic wave receiving unit coincides with said actual measurement data; and electromagnetic-wave-emission-state controlling means for controlling said electromagnetic wave emitting unit in electromagnetic wave emission state in accordance with said electromagnetic-wave-emission-state data, which is obtained by said data compensation means, so as to render said electromagnetic wave emitting unit to emit intended electromagnetic waves resembling those of the object electronic circuit.

3. An electromagnetic wave measuring system according to claim 2, further comprising electromagnetic-wave-emission-state data recording means for recording said electromagnetic-wave-emission-state data obtained by said data compensation means.

4. An electromagnetic wave measuring system according to claim 3, wherein said data compensation means includes:

if said actual measurement data has been obtained over a frequency domain inverse Fourier transformation performing means for performing an inverse Fourier transformation on said actual measurement data to obtain oscillated waveform data over a time domain; and oscillated waveform producing means for producing an oscillated waveform of the electromagnetic wave emitted from said electromagnetic wave emitting unit based on said oscillated waveform data obtained by said inverse Fourier transformation performing means.

5. An electromagnetic wave measuring system according to claim 4, wherein, if there are provided a plurality of sets of said measurement condition data and said actual measurement data in accordance with a plurality of different measurement conditions, said data compensation means controls said measurement condition changing means and said electromagnetic wave emitting unit in electromagnetic wave emission state for the individual sets one after another in a predetermined sequence.

6. An electromagnetic wave measuring system according to claim 5, wherein said data compensation means further includes data sorting means for sorting the plural sets of said measurement condition data and said actual measurement data into an order suitable for the measurement condition changing.

7. An electromagnetic wave measuring system according to claim 3, wherein, if there are provided a plurality of sets of said measurement condition data and said actual measurement data in accordance with a plurality of different measurement conditions, said data compensation means controls said measurement condition changing means and said electromagnetic wave emitting unit in electromagnetic wave emission state for the individual sets one after another in a predetermined sequence.

8. An electromagnetic wave measuring system according to claim 7, wherein said data compensation means further includes data sorting means for sorting the plural sets of said measurement condition data and said actual measurement data into an order suitable for the measurement condition changing.

9. An electromagnetic wave measuring system according to claim 2, wherein said data compensation means includes:

if said actual measurement data has been obtained over a frequency domain inverse Fourier transformation performing means for performing an inverse Fourier transformation on said actual measurement data to obtain oscillated waveform data over a time domain; and oscillated waveform producing means for producing an oscillated waveform of the electromagnetic wave emitted from said electromagnetic wave emitting unit based on said oscillated waveform data obtained by said inverse Fourier transformation performing means.

10. An electromagnetic wave measuring system according to claim 9, wherein, if there are provided a plurality of sets of said measurement condition data and said actual measurement data in accordance with a plurality of different measurement conditions, said data compensation means controls said measurement condition changing means and said electromagnetic wave emitting unit in electromagnetic wave emission state for the individual sets one after another in a predetermined sequence.

11. An electromagnetic wave measuring system according to claim 10, wherein said data compensation means further includes data sorting means for sorting the plural sets of said measurement condition data and said actual measurement data into an order suitable for the measurement condition changing.

12. An electromagnetic wave measuring system according to claim 2, wherein, if there are provided a plurality of sets of said measurement condition data and said actual measurement data in accordance with a plurality of different measurement conditions, said data compensation means controls said measurement condition changing means and said electromagnetic wave emitting unit in electromagnetic wave emission state for the individual sets one after another in a predetermined sequence.

13. An electromagnetic wave measuring system according to claim 12, wherein said data compensation means further includes data sorting means f or sorting the plural sets of said measurement condition data and said actual measurement data into an order suitable for the measurement condition changing.

14. A method of measuring electromagnetic waves of an object electronic circuit in an electromagnetic wave measuring system, which includes an electromagnetic wave emitting unit for emitting electromagnetic waves, an electromagnetic wave receiving unit for receiving electromagnetic waves emitted by the electromagnetic wave emitting unit, measurement condition changing means for changing an electromagnetic wave measurement condition and an electromagnetic wave measuring unit for measuring the electromagnetic waves received by the electromagnetic wave receiving unit, said method comprising the steps of:

(a) obtaining actual measurement data of the object electronic circuit, which data has previously been measured under a predetermined measurement condition, and measurement condition data of said predetermined measurement condition;

(b) controlling the electromagnetic wave emitting unit and the measurement condition changing means based on said actual measurement data of the object electronic circuit and said measurement condition data of said predetermined measurement condition in such a manner that electromagnetic waves resembling those of the object electronic circuit are emitted from said electromagnetic wave emitting unit under the same condition as said predetermined measurement condition; and (c) measuring the electromagnetic waves received by the electromagnetic wave receiving unit wherein said controlling step (b) includes the steps of:

(b1) controlling the measurement condition changing means and the electromagnetic wave emitting unit in electromagnetic wave emission state in accordance with said measurement condition data and said actual measurement data so as to obtain electromagnetic-wave-emission-state data of the electromagnetic wave emitting unit when current measurement data of the electromagnetic waves received by the electromagnetic wave receiving unit coincides with said actual measurement data; and (b2) controlling the electromagnetic wave emitting unit in electromagnetic wave emission state in accordance with said electromagnetic-wave-emission-state data so as to render said electromagnetic wave emitting unit to emit intended electromagnetic waves resembling those of the object electronic circuit.

15. An electromagnetic wave measuring method according to claim 14, further comprising the step of recording said electromagnetic-wave-emission-state data obtained by said controlling step (b1).

16. An electromagnetic wave measuring method according to claim 15, wherein said controlling step (b1) includes the steps of:

if said measurement data is obtained over a frequency domain (b1-a) performing an inverse Fourier transformation on said actual measurement data to obtain oscillated waveform data over a time domain; and (b1-b) producing an oscillated waveform of the electromagnetic wave emitted from the electromagnetic wave emitting unit based on said oscillated waveform data obtained by said inverse Fourier transform performing step (b1-a).

17. An electromagnetic wave measuring method according to claim 16, wherein, if there are provided a plurality of sets of said measurement condition data and said actual measurement data in accordance with a plurality of different measurement conditions, said controlling step (b1) further includes the step of controlling the measurement condition changing means and the electromagnetic wave emitting unit in electromagnetic wave emission state for the individual sets one after another in a predetermined sequence.

18. An electromagnetic wave measuring method according to claim 17, wherein said controlling step (b1) further includes the step of sorting said plural sets of said measurement condition data and said actual measurement data into an order suitable for the measurement condition changing.

19. An electromagnetic wave measuring method according to claim 15, wherein, if there are provided a plurality of sets of said measurement condition data and said actual measurement data in accordance with a plurality of different measurement conditions, said controlling step (b1) further includes the step of controlling the measurement condition changing means and the electromagnetic wave emitting unit in electromagnetic wave emission state for the individual sets one after another in a predetermined sequence.

20. An electromagnetic wave measuring method according to claim 19, wherein said controlling step (b1) further includes the step of sorting said plural sets of said measurement condition data and said actual measurement data into an order suitable for the measurement condition changing.

21. An electromagnetic wave measuring method according to claim 14, wherein said controlling step (b1) includes the steps of:

if said measurement data is obtained over a frequency domain (b1-a) performing an inverse Fourier transformation on said actual measurement data to obtain oscillated waveform data over a time domain; and (b1-b) producing an oscillated waveform of the electromagnetic wave emitted from the electromagnetic wave emitting unit based on said oscillated waveform data obtained by said inverse Fourier transform performing step (b1-a).

22. An electromagnetic wave measuring method according to claim 21, wherein, if there are provided a plurality of sets of said measurement condition data and said actual measurement data in accordance with a plurality of different measurement conditions, said controlling step (b1) further includes the step of controlling the measurement condition changing means and the electromagnetic wave emitting unit in electromagnetic wave emission state for the individual sets one after another in a predetermined sequence.

23. An electromagnetic wave measuring method according to claim 22, wherein said controlling step (b1) further includes the step of sorting said plural sets of said measurement condition data and said actual measurement data into an order suitable for the measurement condition changing.

24. An electromagnetic wave measuring method according to claim 14, wherein, if there are provided a plurality of sets of said measurement condition data and said actual measurement data in accordance with a plurality of different measurement conditions, said controlling step (b1) further includes the step of controlling the measurement condition changing means and the electromagnetic wave emitting unit in electromagnetic wave emission state for the individual sets one after another in a predetermined sequence.

25. An electromagnetic wave measuring method according to claim 24, wherein said controlling step (b1) further includes the step of sorting said plural sets of said measurement condition data and said actual measurement data into an order suitable for the measurement condition changing.

26. A recording medium in which an electromagnetic wave measurement control program for controlling an electromagnetic wave measuring system is recorded, the electromagnetic wave measuring system including an electromagnetic wave emitting unit for emitting electromagnetic waves, an electromagnetic wave receiving unit for receiving electromagnetic waves emitted by the electromagnetic wave emitting unit, measurement condition changing means for changing an electromagnetic wave measurement condition and an electromagnetic wave measuring unit for measuring the electromagnetic waves received by the electromagnetic wave receiving unit, wherein said electromagnetic wave measurement control program instructs a computer to control the electromagnetic wave measuring system to function comprising the steps of:

(a) obtaining actual measurement data of an object electronic circuit, which data has previously been measured under a predetermined measurement condition, and measurement condition data of said predetermined measurement condition; and (b) controlling the electromagnetic wave emitting unit and the measurement condition changing means based on said actual measurement data of the object electronic circuit and said measurement condition data of said predetermined measurement condition in such a manner that electromagnetic waves resembling those of the object electronic circuit are emitted from said electromagnetic wave emitting unit under the same condition as said predetermined measurement condition, wherein said controlling step (b) includes the steps of:

(b1) controlling the measurement condition changing means and the electromagnetic wave emitting unit in electromagnetic wave emission state in accordance with said measurement condition data and said actual measurement data so as to obtain electromagnetic-wave-emissionstate data of the electromagnetic wave emitting unit when current measurement data of the electromagnetic waves received by the electromagnetic wave receiving unit coincides with said actual measurement data; and (b2) controlling the electromagnetic wave emitting unit in electromagnetic wave emission state in accordance with said electromagnetic-wave-emissionstate data so as to render said electromagnetic wave emitting unit to emit intended electromagnetic waves resembling those of the object electronic circuit.

27. A recording medium according to claim 26, wherein said electromagnetic wave measurement control program further instructs the computer to execute the step of recording said electromagnetic-wave-emission-state data obtained by said controlling step (b1).

28. A recording medium according to claim 27, wherein said controlling step (b1) includes the steps of:

if said measurement data is obtained over a frequency domain (b1-a) performing an inverse Fourier transformation on said actual measurement data to obtain oscillated waveform data over a time domain; and (b1-b) producing an oscillated waveform of the electromagnetic wave emitted from the electromagnetic wave emitting unit based on said oscillated waveform data obtained by said inverse Fourier transform performing step (b1-a).

29. A recording medium according to claim 28, wherein, if there are provided a plurality of sets of said measurement condition data and said actual measurement data in accordance with a plurality of different measurement conditions, said controlling step (b1) further includes the step of controlling the measurement condition changing means and the electromagnetic wave emitting unit in electromagnetic wave emission state for the individual sets one after another in a predetermined sequence.

30. A recording medium according to claim 29, wherein said controlling step (b1) further includes the step of sorting the plural sets of said measurement condition data and said actual measurement data into an order suitable for the measurement condition changing.

31. A recording medium according to claim 27, wherein, if there are provided a plurality of sets of said measurement condition data and said actual measurement data in accordance with a plurality of different measurement conditions, said controlling step (b1) further includes the step of controlling the measurement condition changing means and the electromagnetic wave emitting unit in electromagnetic wave emission state for the individual sets one after another in a predetermined sequence.

32. A recording medium according to claim 31, wherein said controlling step (b1) further includes the step of sorting the plural sets of said measurement condition data and said actual measurement data into an order suitable for the measurement condition changing.

33. A recording medium according to claim 26, wherein said controlling step (b1) includes the steps of:

if said measurement data is obtained over a frequency domain (b1-a) performing an inverse Fourier transformation on said actual measurement data to obtain oscillated waveform data over a time domain; and (b1-b) producing an oscillated waveform of the electromagnetic wave emitted from the electromagnetic wave emitting unit based on said oscillated waveform data obtained by said inverse Fourier transform performing step (b1-a).

34. A recording medium according to claim 33, wherein, if there are provided a plurality of sets of said measurement condition data and said actual measurement data in accordance with a plurality of different measurement conditions, said controlling step (b1) further includes the step of controlling the measurement condition changing means and the electromagnetic wave emitting unit in electromagnetic wave emission state for the individual sets one after another in a predetermined sequence.

35. A recording medium according to claim 34, wherein said controlling step (b1) further includes the step of sorting the plural sets of said measurement condition data and said actual measurement data into an order suitable for the measurement condition changing.

36. A recording medium according to claim 26, wherein, if there are provided a plurality of sets of said measurement condition data and said actual measurement data in accordance with a plurality of different measurement conditions, said controlling step (b1) further includes the step of controlling the measurement condition changing means and the electromagnetic wave emitting unit in electromagnetic wave emission state for the individual sets one after another in a predetermined sequence.

37. A recording medium according to claim 36, wherein said controlling step (b1) further includes the step of sorting the plural sets of said measurement condition data and said actual measurement data into an order suitable for the measurement condition changing.

38. A method of measuring electromagnetic waves of an object electronic circuit in an electromagnetic wave measuring system, which includes an electromagnetic wave emitting unit for emitting electromagnetic waves, an electromagnetic wave receiving unit for receiving electromagnetic waves emitted by the electromagnetic wave emitting unit, measurement condition changing means for changing an electromagnetic wave measurement condition and an electromagnetic wave measuring unit for measuring the electromagnetic waves received by the electromagnetic wave receiving unit, said method comprising the steps of:

(a) obtaining a plurality of actual measurement data pieces of the object electronic circuit, each data piece having previously been measured at a predetermined site under an associated one of a plurality of predetermined measurement conditions, and measurement condition data of said plural predetermined measurement conditions;

(b) controlling the electromagnetic wave emitting unit and the measurement condition changing means at the predetermined site based on said plural actual measurement data pieces of the object electronic circuit and said measurement condition data of said plural predetermined measurement conditions in such a manner that electromagnetic waves resembling those of the object electronic circuit are emitted from said electromagnetic wave emitting unit under the same condition as each said predetermined measurement condition; and (c) measuring the electromagnetic waves received by the electromagnetic wave receiving unit under each said predetermined condition.

39. A recording medium in which an electromagnetic wave measurement control program for controlling an electromagnetic wave measuring system is recorded, the electromagnetic wave measuring system including an electromagnetic wave emitting unit for emitting electromagnetic waves, an electromagnetic wave receiving unit for receiving electromagnetic waves emitted by the electromagnetic wave emitting unit, measurement condition changing means for changing an electromagnetic wave measurement condition and an electromagnetic wave measuring unit for measuring the electromagnetic waves received by the electromagnetic wave receiving unit, wherein said electromagnetic wave measurement control program instructs a computer to control the electromagnetic wave measuring system to function comprising the steps of:

(a) obtaining a plurality of actual measurement data pieces of an object electronic circuit, each data pieces having previously been measured at a predetermined site under an associated one of a plurality of predetermined measurement conditions, and measurement condition data of said plural predetermined measurement conditions; and (b) controlling the electromagnetic wave emitting unit and the measurement condition changing means at the predetermined site based on said plural actual measurement data pieces of the object electronic circuit and said measurement condition data of said plural predetermined measurement conditions in such a manner that electromagnetic waves resembling those of the object electronic circuit are emitted from said electromagnetic wave emitting unit under the same condition as each said predetermined measurement condition.

* * * * *